(12) United States Patent
Tazaki et al.

(10) Patent No.: US 11,388,844 B2
(45) Date of Patent: Jul. 12, 2022

(54) SWITCHING POWER SUPPLY DEVICE

(71) Applicant: Panasonic Intellectual Property Management Co., Ltd., Osaka (JP)

(72) Inventors: Shintaro Tazaki, Kanagawa (JP); Kento Mochizuki, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 225 days.

(21) Appl. No.: 16/909,325

(22) Filed: Jun. 23, 2020

(65) Prior Publication Data

US 2020/0323101 A1 Oct. 8, 2020

Related U.S. Application Data

(63) Continuation of application No. PCT/JP2018/047539, filed on Dec. 25, 2018.

(30) Foreign Application Priority Data

Dec. 27, 2017 (JP) .............................. JP2017-251243

(51) Int. Cl.
*H02M 1/42* (2007.01)
*H05K 7/20* (2006.01)
(Continued)

(52) U.S. Cl.
CPC ............ *H05K 7/2089* (2013.01); *H02M 1/42* (2013.01); *H02M 1/44* (2013.01); *H02M 3/155* (2013.01);
(Continued)

(58) Field of Classification Search
CPC .......... H02M 1/42; H02M 1/44; H02M 3/155; H05K 1/144
(Continued)

(56) References Cited

U.S. PATENT DOCUMENTS

2013/0301312 A1\* 11/2013 Konishi ................ H02M 3/337
363/21.15
2017/0019029 A1 1/2017 Gekinozu et al.

FOREIGN PATENT DOCUMENTS

JP 2017-22337 A 1/2017

OTHER PUBLICATIONS

International Search Report, dated Mar. 19, 2019, for International Application No. PCT/JP2018/047539, 3 pages.
(Continued)

*Primary Examiner* — Tomi Skibinski
(74) *Attorney, Agent, or Firm* — Seed IP Law Group LLP

(57) ABSTRACT

This switching power supply device having a plurality of power supply circuits to be connected to a multi-phase power supply, is provided with: a first substrate on which an electric component constituting a filter circuit is mounted, the output end of the filter circuit being provided on one end side in a first direction; a second substrate on which a power semiconductor constituting a circuit provided at a stage later than the filter circuit is mounted, the input end of the circuit provided at the stage later than the filter circuit being provided on one end side in a second direction that intersects with the first direction; and a third substrate which is disposed between the first substrate and the second substrate, and on which a wiring pattern for electrically connecting the output end to the input end is formed.

5 Claims, 18 Drawing Sheets

(51) Int. Cl.
    *H02M 1/44*       (2007.01)
    *H02M 3/155*     (2006.01)
    *H05K 1/14*       (2006.01)

(52) U.S. Cl.
    CPC ....... *H05K 1/144* (2013.01); *H05K 2201/042* (2013.01)

(58) Field of Classification Search
    USPC .......................................................... 361/752
    See application file for complete search history.

(56) References Cited

OTHER PUBLICATIONS

Japanese Notice of Reasons for Refusal, dated Feb. 28, 2022, for Japanese Patent Application No. 2019-561708, 2 pages. (English translation).

\* cited by examiner

FIG. 5B
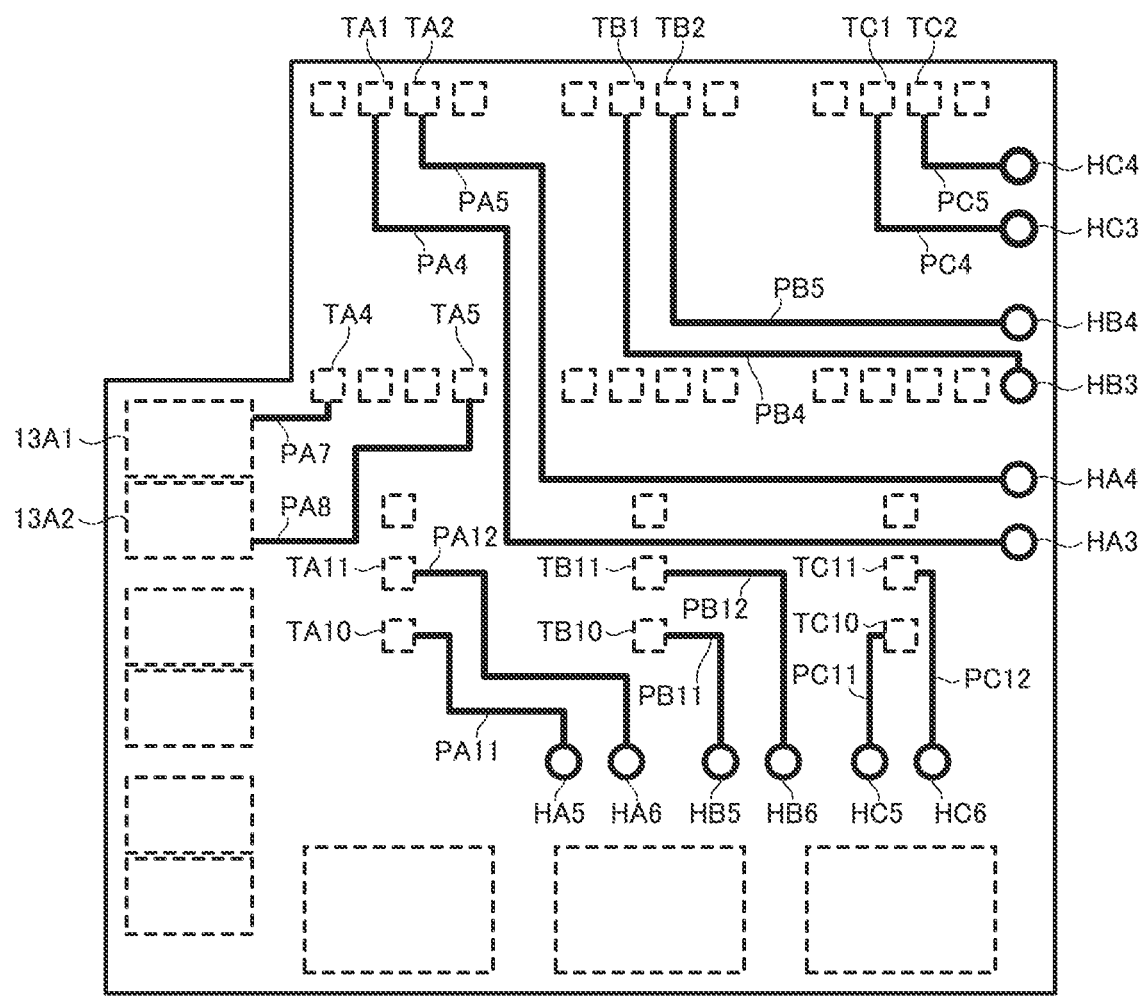
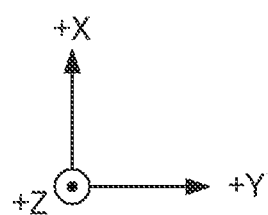

FIG. 6
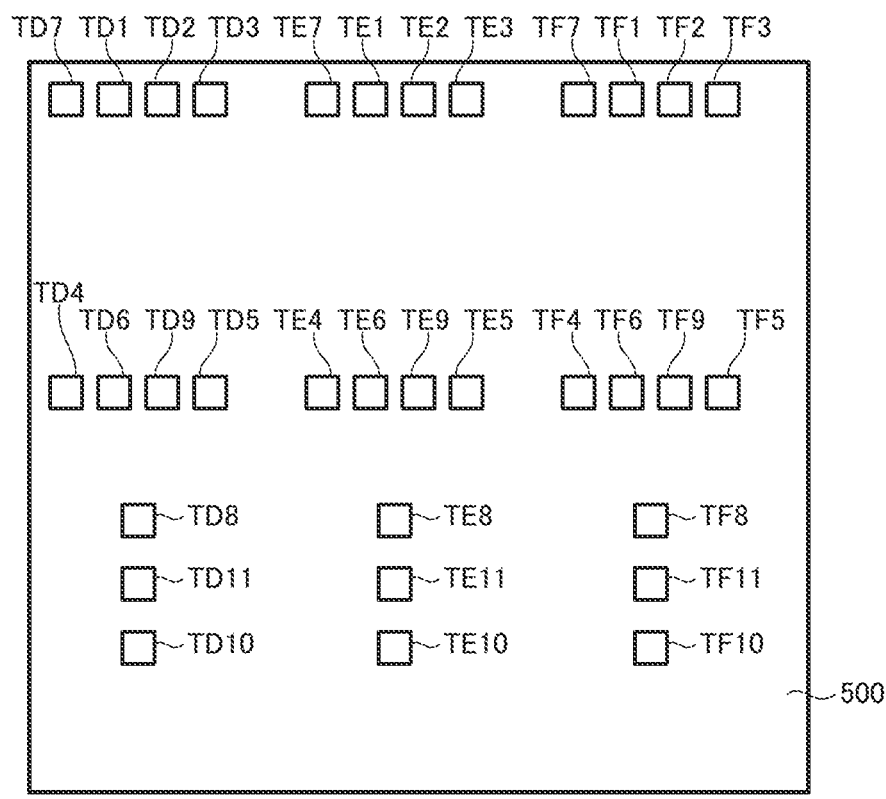
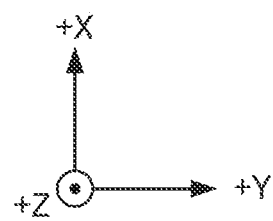

FIG. 7
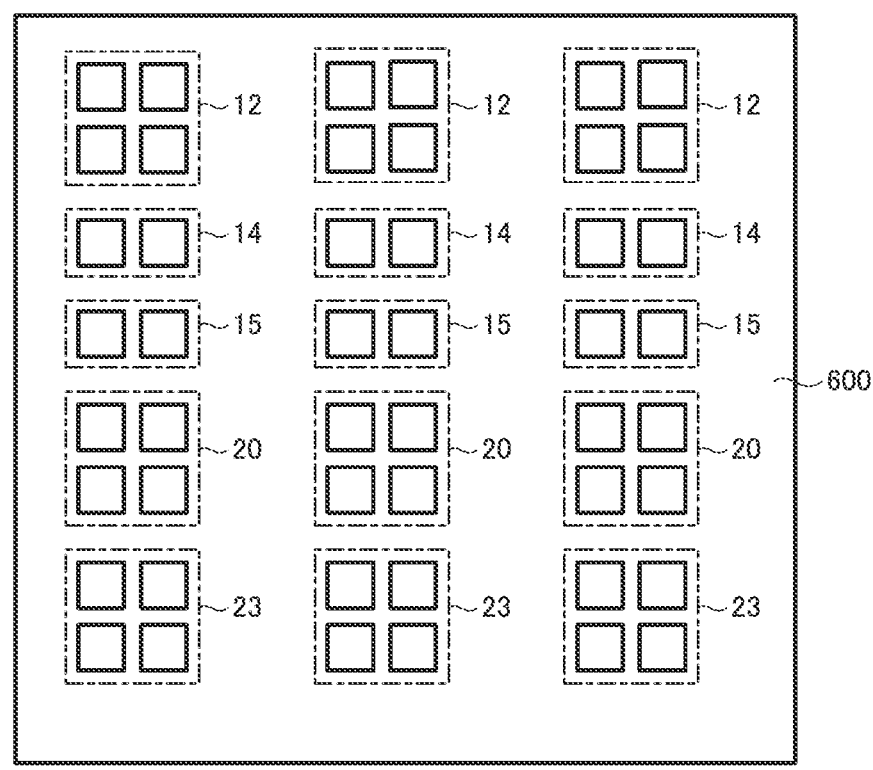
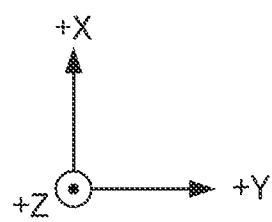

FIG. 9
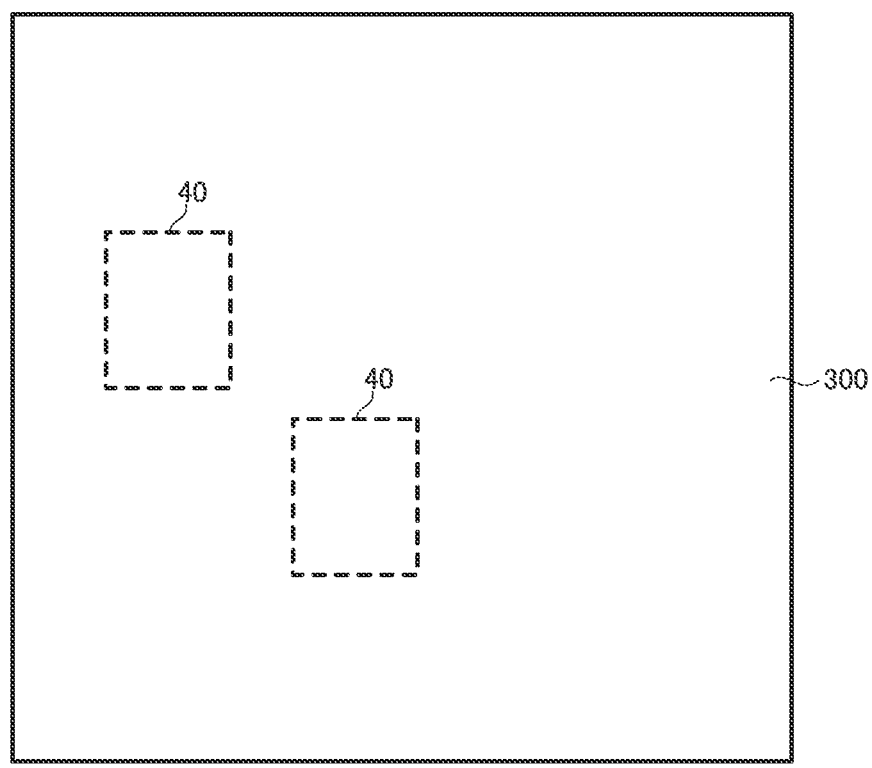
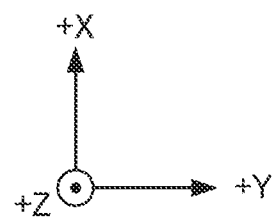

SWITCHING POWER SUPPLY DEVICE

TECHNICAL FIELD

The present disclosure relates to a switching power supply device.

BACKGROUND ART

An in-vehicle switching power supply device has a casing in which a board is disposed. On the board, a power semiconductor for power conversion, a coil, a capacitor, a transformer, and the like are mounted. The power semiconductor generates heat and, thus, is required to be cooled efficiently.

PTL 1 discloses a structure in which a heat sink is built in a casing, boards are disposed in spaces above and below the heat sink, a power semiconductor is mounted on each of the boards, and the boards are electrically connected to each other by wiring.

In PTL 1, the power semiconductors each mounted on one of the boards are in direct contact with the heat sink, so that the cooling efficiency of the power semiconductor is improved while reducing the size of the switching power supply device.

CITATION LIST

Patent Literature

PTL 1
Japanese Patent Application Laid-Open No. 2017-22337

SUMMARY OF INVENTION

Technical Problem

The switching power supply device described in PTL 1 is a single-phase AC switching power supply device. If a switching power supply device capable of supporting a multi-phase AC is configured using the structure described in PTL 1, it is necessary to insulate phases. In addition, wiring for electrically connecting the boards and wiring for electrically connecting the power semiconductor to the coil, capacitor, transformer, and the like become complicated, resulting in an increase in size of the device.

An object of the present disclosure is to provide a switching power supply device capable of supporting a multi-phase AC and efficiently cooling the heat-generating electrical parts while reducing the size thereof.

Solution to Problem

One aspect of the present disclosure is a switching power supply device including a plurality of power supply circuits connected to a multi-phase power supply, including: a first board including, mounted thereon, an electrical part that constitutes a filter circuit for preventing entry of noise from the external power supply, an output end of the filter circuit being provided adjacent to one end in a first direction of the first board; a second board placed on a bottom portion of a casing that accommodates the switching power supply device, the second board including, mounted thereon, a power semiconductor that constitutes a circuit provided at a latter part of the filter circuit, an input end of the circuit provided at the latter part of the filter circuit being provided adjacent to one end in a second direction of the second board, the second direction crossing the first direction; and a third board disposed between the first board and the second board, the third board including, formed thereon, a wiring pattern that electrically connects the output end to the input end.

Advantageous Effects of Invention

According to the present disclosure, a switching power supply device can support a multi-phase AC and cool heat-generating electrical parts while reducing the size thereof.

BRIEF DESCRIPTION OF DRAWINGS

FIG. 5B is a schematic illustration of wiring patterns in a first layer of the junction board;

FIG. 6 is a plan view of a driver board;

FIG. 7 is a plan view of a power module board;

FIG. 9 is a plan view of a control board;

DESCRIPTION OF EMBODIMENTS

A switching power supply device according to an embodiment of the present disclosure is described in detail below with reference to the accompanying drawings. Note that the embodiments described below are only examples, and the present disclosure is not limited thereto.

(Overall Configuration of Switching Power Supply Device)

Figure 1:
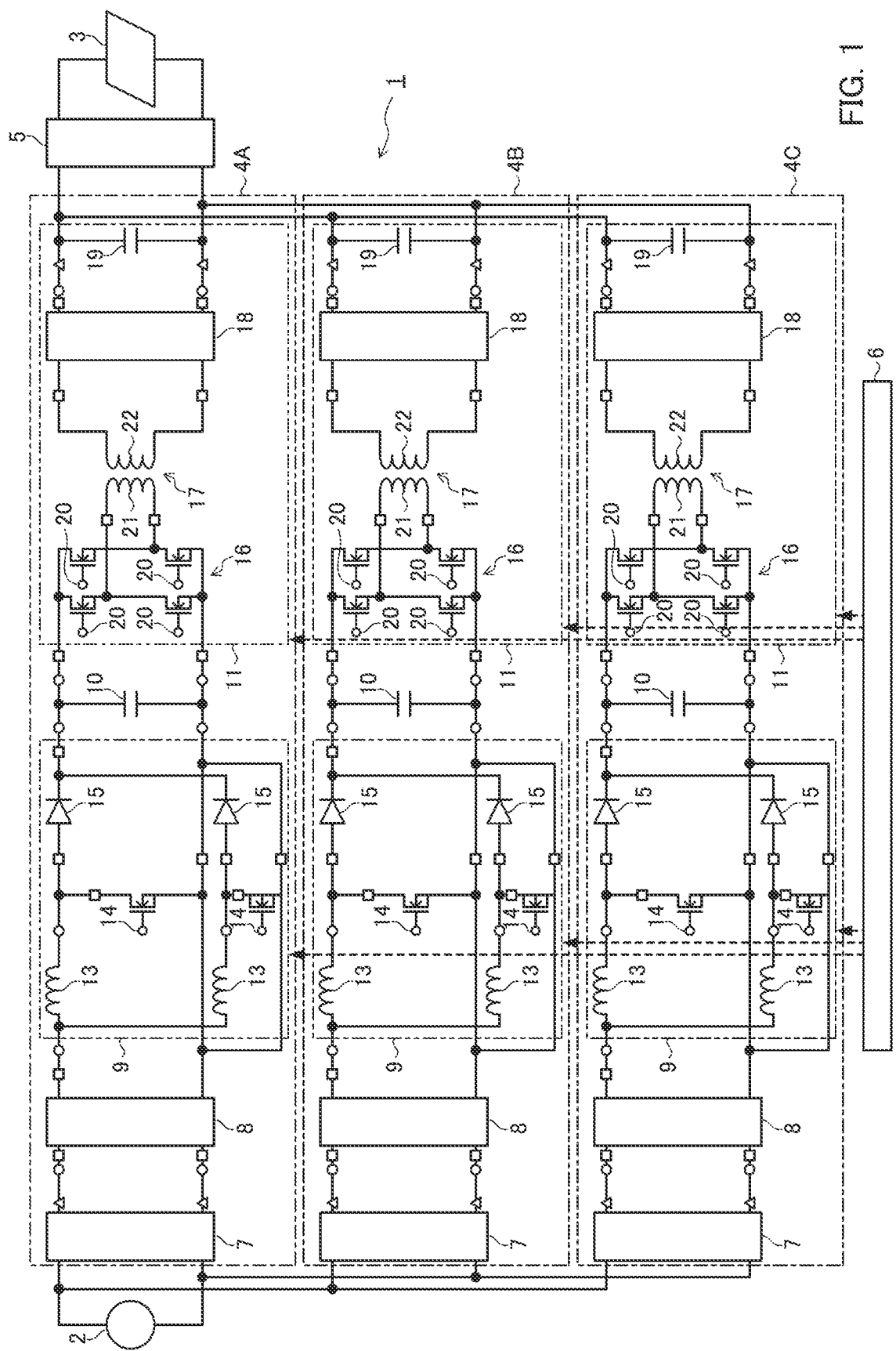
FIG. 1 is a circuit block diagram illustrating the configuration of a switching power supply device according to an embodiment of the present disclosure.

The overall configuration of switching power supply device 1 (hereinafter, simply referred to as "power supply device 1") is described with reference to FIG. 1. FIG. 1 is a circuit block diagram illustrating the configuration of power supply device 1. Note that in FIG. 1, white triangles, circles, and squares are illustrated on a power line. The white triangles indicate connecting portions 29 (described below). In addition, white circles indicate connecting portions 28 (described below). Furthermore, white squares indicate connecting portions 27 (described below).

Power supply device 1 is mounted in a vehicle, such as an electric vehicle, and converts AC power from external power supply 2 that is a three-phase AC power supply into DC power and outputs the DC power to battery 3. Battery 3 is, for example, a battery used to drive an electric motor of the vehicle. An example of battery 3 is a lithium ion battery.

Power supply device 1 includes power supply circuits 4A, 4B, and 4C each corresponding to one of the phases of external power supply 2, DC filter circuit 5, and control circuit 6. Each of power supply circuits 4A, 4B, and 4C includes AC filter circuit 7, single-phase full-wave rectifier circuit 8, power factor correction circuit 9, capacitor 10, and DC/DC converter 11.

AC filter circuit 7 reduces noise that is transmitted from external power supply 2 into the latter part of AC filter circuit 7 and noise that flows out of the latter part of AC filter circuit 7 into external power supply 2. AC filter circuit 7 includes a coil, a capacitor, and the like.

Single-phase full-wave rectifier circuit 8 performs full-wave rectification on the AC power input from AC filter circuit 7 to convert the AC power into DC power. Thereafter, single-phase full-wave rectifier circuit 8 outputs the DC power to power factor correction circuit 9. Single-phase full-wave rectifier circuit 8 is a diode bridge circuit including four diodes 12 (not illustrated in FIG. 1).

Power factor correction circuit 9 is a circuit having a function of correcting the power factor of the power input from single-phase full-wave rectifier circuit 8 and boosting the voltage of the input power. Power factor correction circuit 9 has coil 13, switching element 14, and diode 15.

Each of power supply circuits 4A, 4B, and 4C has two power factor correction circuits 9 connected in parallel between single-phase full-wave rectifier circuit 8 and capacitor 10. In this way, an interleaved power factor correction circuit is formed.

Capacitor 10 is connected to the output side of power factor correction circuit 9 and smoothes the DC power output from power factor correction circuit 9. Since the voltage of the DC power is boosted by power factor correction circuit 9, capacitor 10 has a relatively large capacity.

DC/DC converter 11 is a circuit that converts the output of power factor correction circuit 9 into a voltage at which battery 3 can be charge. DC/DC converter 11 includes inverter 16, transformer 17, secondary side rectifier circuit 18, and capacitor 19.

Inverter 16 converts DC power input from power factor correction circuit 9 into AC power and outputs the AC power to transformer 17. Inverter 16 includes four switching elements 20.

Transformer 17 transforms the voltage of the AC power input from inverter 16 and outputs the voltage to secondary side rectifier circuit 18. Transformer 17 includes power transmission coil 21 connected to the output side of inverter 16 and power reception coil 22 connected to the input side of secondary side rectifier circuit 18.

Secondary side rectifier circuit 18 is a circuit that converts AC power input from transformer 17 into DC power. Secondary side rectifier circuit 18 is a diode bridge circuit including four diodes 23 (not illustrated in FIG. 1).

Capacitor 19 is connected to the output side of secondary side rectifier circuit 18 and smoothes the DC current output from secondary side rectifier circuit 18.

DC filter circuit 5 is provided at the latter part of power supply circuits 4A, 4B, and 4C. DC filter circuit 5 reduces noise flowing out of each of the power supply circuits into battery 3 and noise that is transmitted to each of the power supply circuits from battery 3. DC filter circuit 5 includes a coil, a capacitor, and the like.

Control circuit 6 controls the operation performed by each of the power supply circuits by controlling on/off of the switching elements 14 of power factor correction circuit 9 and switching elements 20 of DC/DC converter 11 in each of the power supply circuits.

That is, under the control of control circuit 6, battery 3 is charged with the electric power supplied from external power supply 2 via each of the power supply circuits. Control circuit 6 includes a microcomputer, an integrated circuit, and the like mounted on a board.

(Configuration of Switching Power Supply Device)

Figure 2:
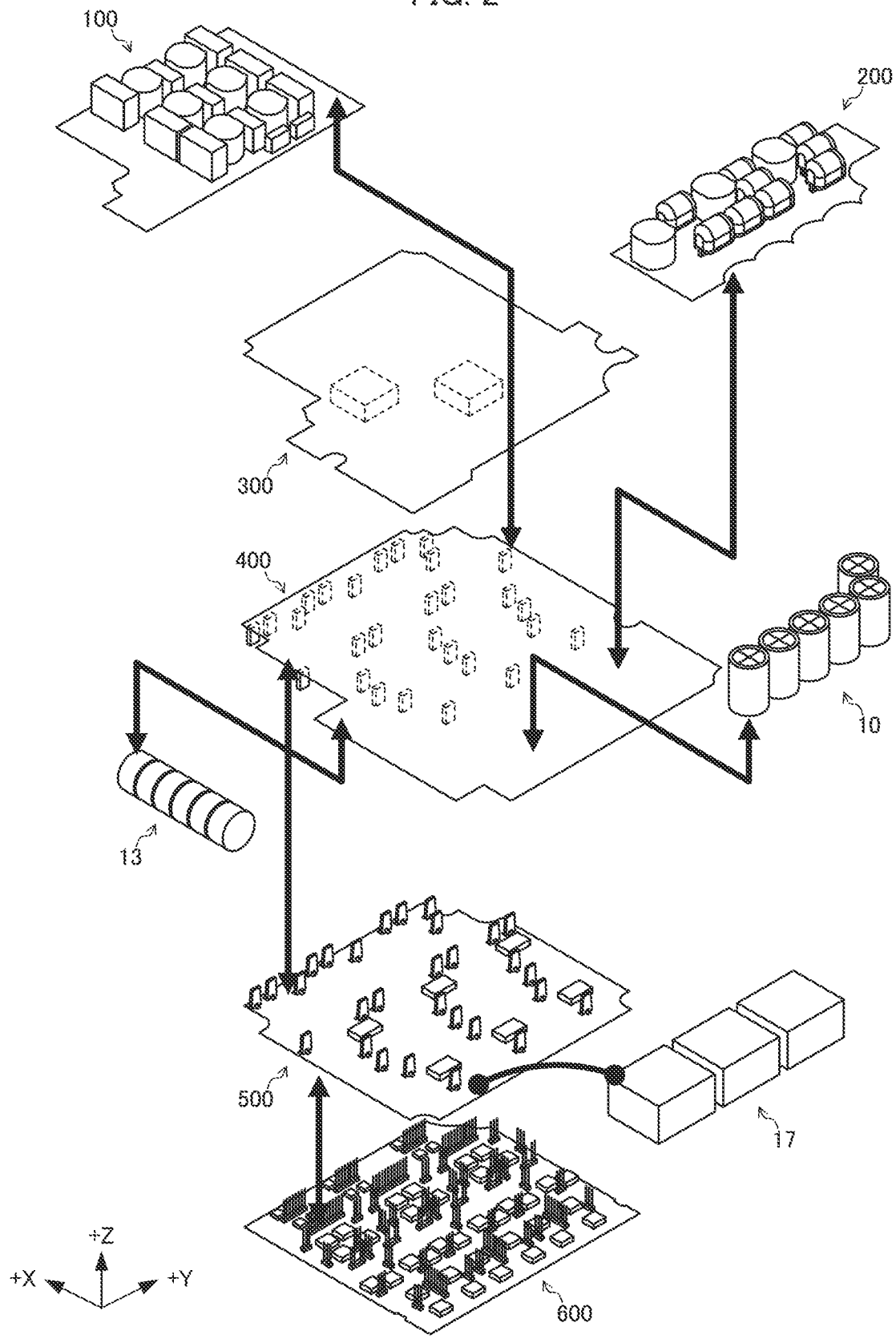
FIG. 2 is an exploded perspective view illustrating the configuration of the switching power supply device according to an embodiment of the present disclosure.
Figure 3:
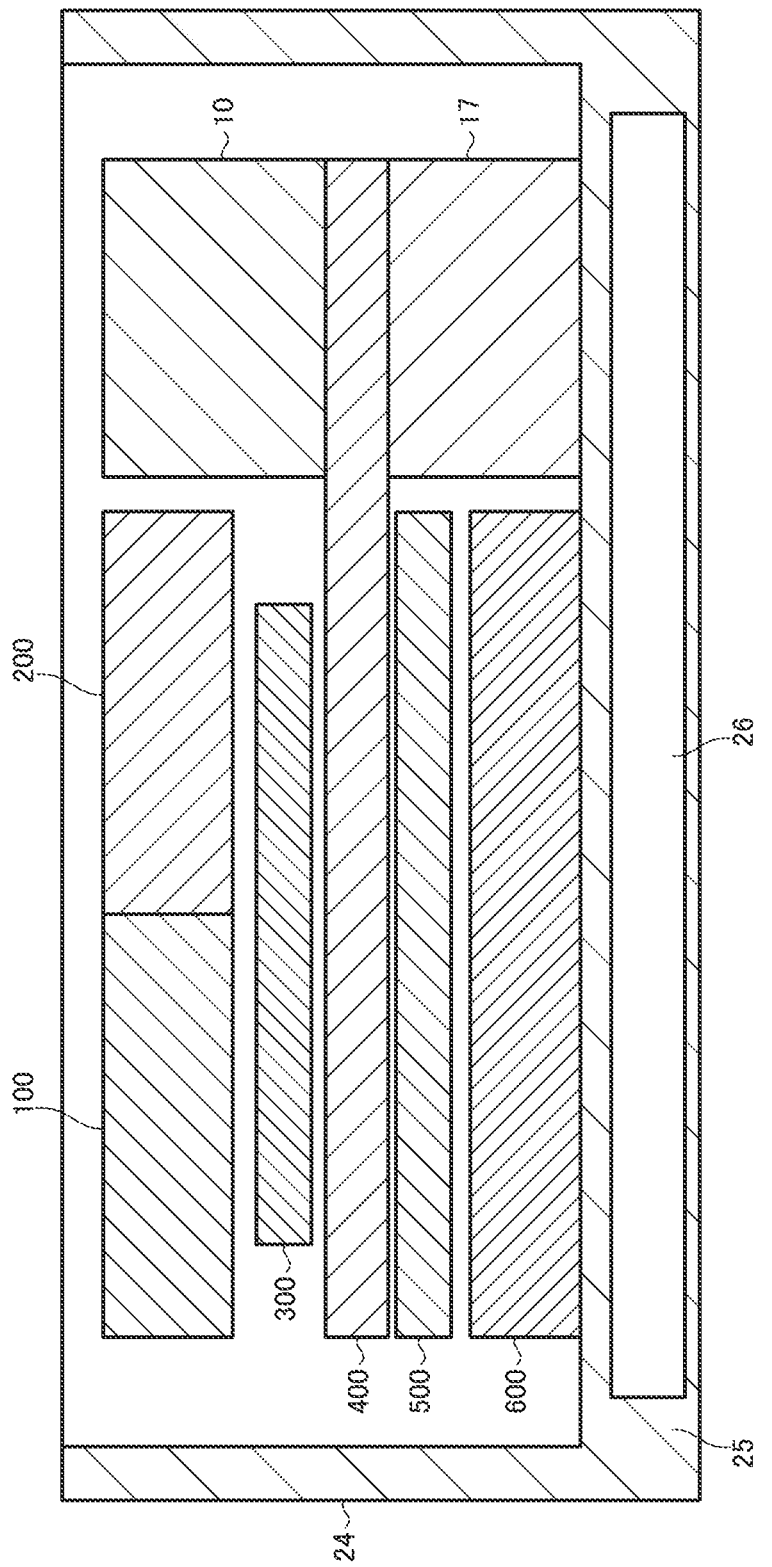
FIG. 3 is a cross-sectional view illustrating the configuration of the switching power supply device according to an embodiment of the present disclosure.
Figure 4:
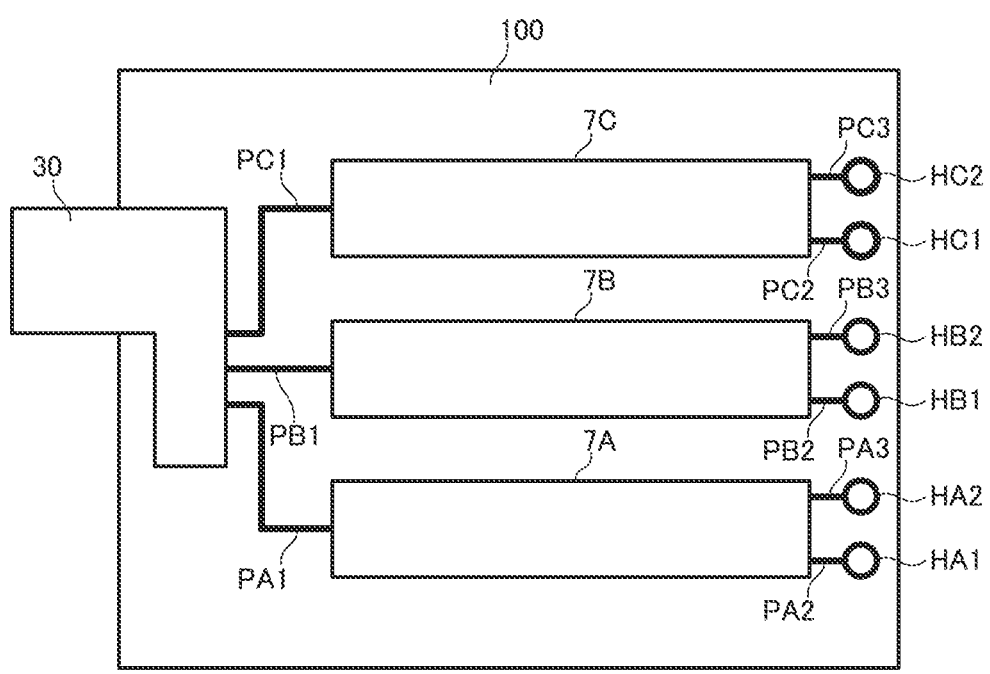
FIG. 4 is a plan view of an AC filter board.
Figure 5A:
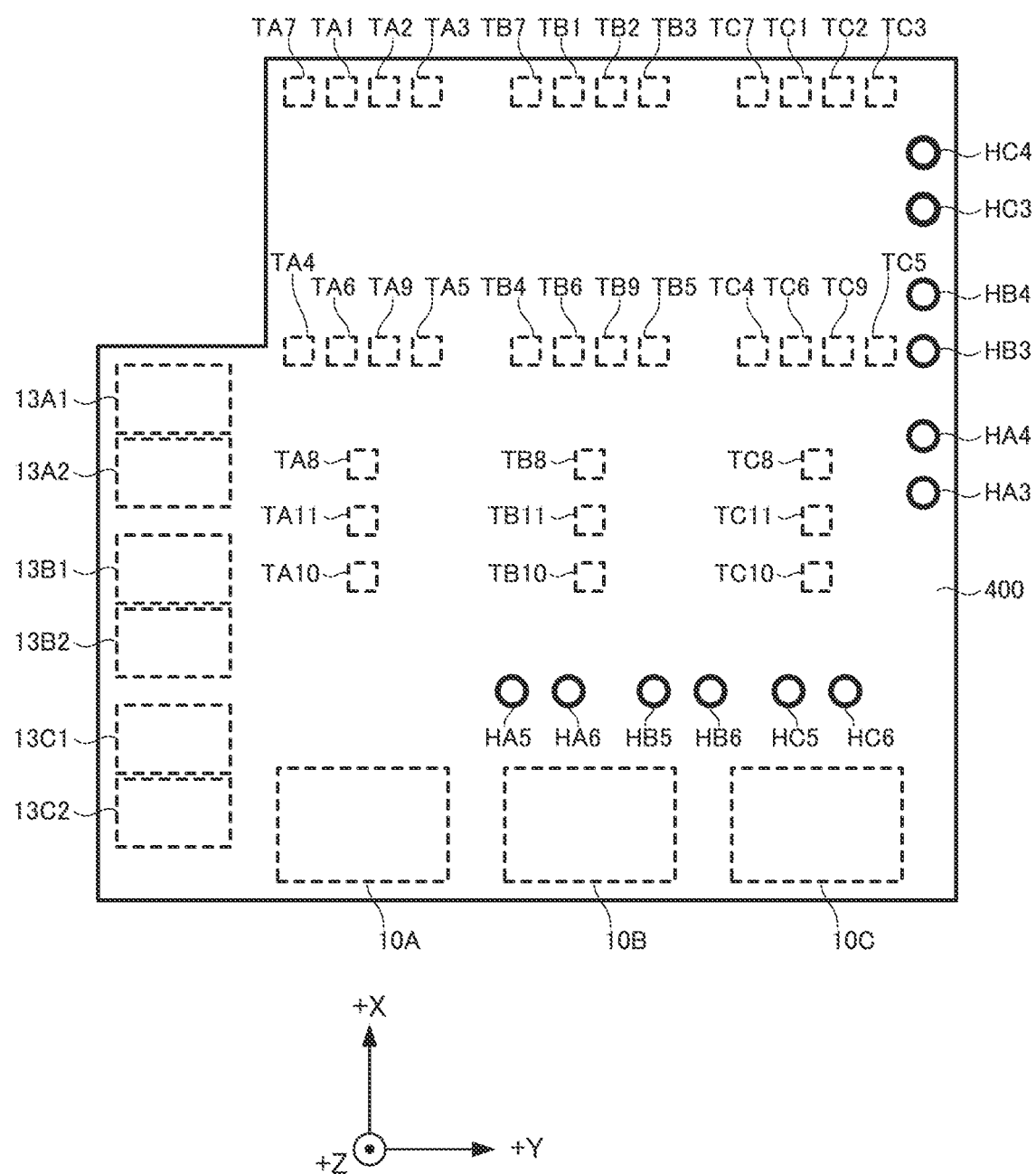
FIG. 5A is a plan view of a junction board.
Figure 8:
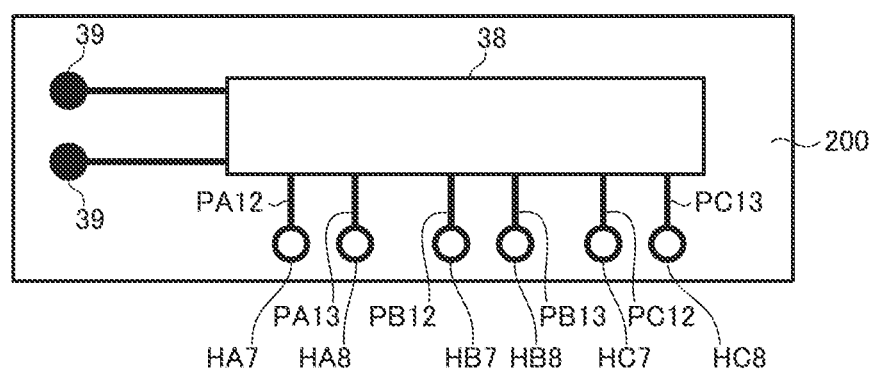
FIG. 8 is a plan view of a DC filter board.

The configuration of power supply device 1 is described below with reference to FIGS. 2 to 12B. FIG. 2 is an exploded perspective view illustrating the configuration of power supply device 1. FIG. 3 is a cross-sectional view illustrating the configuration of power supply device 1. FIG. 4 is a plan view of AC filter board 100. FIG. 5A is a plan view of junction board 400. FIGS. 5B to 5E are diagrams illustrating wiring patterns in first to fourth layers of junction board 400. FIG. 6 is a plan view of driver board 500. FIG. 7 is a plan view of power module board 600. FIG. 8 is a plan view of DC filter board 200. FIG. 9 is a plan view of control board 300. Note that FIGS. 2 to 9 schematically illustrate the configuration of power supply device 1, and some parts and wiring not directly related to the description are not illustrated. In addition, in FIGS. 2 to 9, common X-axis, Y-axis and Z-axis are illustrated. The positive direction of the X-axis is defined as a "+X direction", the positive direction of the Y-axis is defined as a "+Y direction", and the positive direction of the Z-axis is defined as a "+Z direction" (an upward direction).

As illustrated in FIG. 2, power supply device 1 includes AC filter board 100, DC filter board 200, control board 300, junction board 400, driver board 500, and power module board 600. Each of these boards is a substantially rectangular thin plate member extending in an XY plane.

As illustrated in FIG. 3, AC filter board 100, DC filter board 200, control board 300, junction board 400, driver board 500, and power module board 600 are accommodated in casing 24.

Casing 24 includes a side portion and a bottom portion. Casing 24 has a box shape with an open top. Water jacket 26 that allows cooling water to flow therethrough is formed in bottom portion 25 of casing 24. Power module board 600 is directly placed on bottom portion 25. A plurality of heat-generating electrical parts are mounted on the upper surface of power module board 600, and power module board 600 is directly placed on bottom portion 25. Thus, the heat-generating electrical parts mounted on the upper surface of power module board 600 can be efficiently cooled.

As described in detail below, since the plurality of heat-generating electrical parts mounted on power module board 600 are formed as chip components, the contact area between the heat-generating electrical parts and power module board 600 is large, which also makes it possible to efficiently cool the heat-generating electrical parts.

Driver board 500 is disposed above power module board 600 with a gap therebetween. Power module board 600 and driver board 500 are mechanically and electrically connected to each other by connecting portion 27 (described below).

Junction board 400 is disposed above driver board 500 with a gap therebetween. Driver board 500 and junction board 400 are mechanically and electrically connected to each other by connecting portion 28 (described below).

Control board 300 is disposed above junction board 400 with a gap therebetween.

AC filter board 100 and DC filter board 200 are disposed above control board 300 with a gap between control board 300 and each of AC filter board 100 and DC filter board 200. AC filter board 100 and DC filter board 200 are mechanically and electrically connected to junction board 400 by connecting portion 29 (described below).

(AC Filter Board)

AC filter board 100 is described with reference to FIG. 4. AC filter board 100 is configured by forming a wiring pattern on an insulating plate that serves as a base.

Electrical parts, such as connector 30 and a coil and a capacitor constituting AC filter circuit 7, are mounted on the upper surface of AC filter board 100, and each of the electrical parts is connected to a wiring pattern. More specifically, the leads of the electrical parts are inserted into the lead through-holes (not illustrated) provided in AC filter board 100 so as to penetrate from the upper surface to the lower surface, and soldering is performed.

Three AC filter circuits 7A, 7B, and 7C corresponding to the U-phase, V-phase, and W-phase of three-phase AC, respectively, are disposed on AC filter board 100, side by side, along the X-axis. More specifically, AC filter circuit 7A is disposed adjacent to a −X end of AC filter board 100, AC filter circuit 7B is disposed adjacent to the +X side of AC filter circuit 7A, and AC filter circuit 7C is disposed adjacent to the +X side of AC filter circuit 7B. The AC filter circuits are electrically insulated from one another.

Electric power is supplied to each of AC filter circuits 7A, 7B, and 7C via connector 30 connectable to external power supply 2. Connector 30 is provided adjacent to the −Y end of AC filter board 100, and connector 30 and the input end of each of AC filter circuits 7A, 7B, and 7C are electrically connected to each other by a wiring pattern. Note that in FIG. 4, among the wiring patterns for connecting connector 30 to the input terminals of AC filter circuits 7A, 7B, and 7C, only wiring patterns PA1, PB1, and PC1 on the positive side are schematically illustrated.

As described above, each of the AC filter circuits includes electrical parts, such as a coil and a capacitor, mounted on AC filter board 100. The electrical parts are arranged at predetermined positions so as to be aligned in substantially the +Y direction from the input side (the side adjacent to external power supply 2) to the output side (the side adjacent to battery 3) of the AC filter circuits. Accordingly, the output end of each of the AC filter circuits is located adjacent to the +Y end of AC filter board 100.

Wiring patterns PA2 (the positive side) and PA3 (the negative side) extending from the output end of AC filter circuit 7A reach through-holes HA1 and HA2, respectively. Wiring patterns PB2 (the positive side) and PB3 (the negative side) extending from the output end of AC filter circuit 7B reach through-holes HB1 and HB2, respectively. Wiring patterns PC2 (the positive side) and PC3 (the negative side) extending from the output end of AC filter circuit 7C reach through-holes HC1 and HC2, respectively.

Through-holes HA1, HA2, HB1, HB2, HC1, and HC2 are holes that pass through AC filter board 100 in the Z direction. Through-holes HA1, HA2, HB1, HB2, HC1, and HC2 are provided adjacent to the +Y end of AC filter board 100 so as to be arranged in the +X direction.

(Junction Board)

Junction board 400 is described with reference to FIG. 5A. Junction board 400 is configured by forming wiring patterns on each of layers of an insulating substrate having a multilayer structure.

Junction board 400 basically serves as wiring to connect the electrical parts in each of power supply circuits 4A, 4B, and 4C to each other.

Through-holes HA3, HA4, HB3, HB4, HC3, and HC4 corresponding to the above-described through-holes HA1, HA2, HB1, HB2, HC1, and HC2, respectively, are provided adjacent to the +Y side end of junction board 400 so as to be arranged in the +X direction.

In addition, a plurality of through-holes HA5, HA6, HB5, HB6, HC5, and HC6 are provided at a location closer to the −X end than through-hole HA3 so as to be arranged in the +Y direction.

Furthermore, a plurality of terminals TA1, TA2, TA3, TA4, TA5, TA6, TA7, TA8, TA9, TA10, and TA11 related to power supply circuit 4A are provided so as to protrude from the lower surface of junction board 400 in the −Z direction.

Still furthermore, a plurality of terminals TB1, TB2, TB3, TB4, TB5, TB6, TB7, TB8, TB9, TB10, and TB11 related to power supply circuit 4B are provided so as to protrude from the lower surface of junction board 400 in the −Z direction.

Yet still furthermore, a plurality of terminals TC1, TC2, TC3, TC4, TC5, TC6, TC7, TC8, TC9, TC10, and TC11 related to power supply circuit 4C are provided so as to protrude from the lower surface of junction board 400 in the −Z direction.

These terminals, which are provided so as to protrude from the lower surface of junction board 400 in the −Z direction, have all the same shape.

In addition, a plurality of coils 13A1, 13A2, 13B1, 13B2, 13C1, and 13C2 are mounted on the lower surface of junction board 400 at a location adjacent to the −Y end so as to be arranged in the −X direction. More specifically, the leads of the coils are inserted into lead through-holes (not illustrated) provided in junction board 400 so as to penetrate from the lower surface to the upper surface, and soldering is performed.

Furthermore, capacitors 10A, 10B, and 10C are mounted on the upper surface of junction board 400 at a location adjacent to the −X end so as to be arranged in the +Y direction. More specifically, the leads of the electrolytic capacitors are inserted into lead through-holes provided in junction board 400 so as to penetrate from the upper surface to the lower surface, and soldering is performed.

(Wiring Patterns in Each of Layers of Junction Board)

The wiring patterns in each of the layers of junction board 400 are described with reference to FIGS. 5B to 5E. The wiring patterns in a first layer are first described. FIG. 5B is a schematic illustration of the wiring patterns in the first layer of junction board 400.

In the first layer, as a configuration related to power supply circuit 4A, wiring pattern PA4 connects through-hole HA3 to terminal TA1. More specifically, wiring pattern PA4 having one end connected to through-hole HA3 extends in the +X direction and the −Y direction and reaches terminal TA1.

In addition, wiring pattern PA5 connects through-hole HA4 to terminal TA2. More specifically, wiring pattern PA5 having one end connected to through-hole HA4 extends in the +X direction and the −Y direction and reaches terminal TA2.

Furthermore, wiring pattern PA11 connects terminal TA10 to through-hole HA5. More specifically, wiring pattern PA11 having one end connected to terminal TA10 extends in the −X direction and reaches through-hole HA5.

Still furthermore, wiring pattern PA12 connects terminal TA11 to through-hole HA6. More specifically, wiring pattern PA12 having one end connected to terminal TA11 extends in the −X direction and reaches through-hole HA6.

Yet still furthermore, wiring pattern PA7 connects the output end of coil 13A1 to terminal TA4. More specifically, wiring pattern PA7 having one end connected to the output end of coil 13A1 extends in the +Y direction and reaches terminal TA4.

Yet still furthermore, wiring pattern PA8 connects the output end of coil 13A2 to terminal TA5. More specifically, wiring pattern PA8 having one end connected to the output end of coil 13A2 extends in the +Y direction and reaches terminal TA5.

As the configuration related to power supply circuit 4B, wiring pattern PB4 connects through-hole HB3 to terminal TB1. More specifically, wiring pattern PB4 having one end connected to through-hole HB3 extends in the +X direction and the −Y direction and reaches terminal TB1.

In addition, wiring pattern PB5 connects through-hole HB4 to terminal TB2. More specifically, wiring pattern PB5 having one end connected to through-hole HB4 extends in the +X direction and the −Y direction and reaches terminal TB2.

Furthermore, wiring pattern PB11 connects terminal TB10 to through-hole HB5. More specifically, wiring pattern PB11 having one end connected to terminal TB10 extends in the −X direction and reaches through-hole HB5.

Still furthermore, wiring pattern PB12 connects terminal TB11 to through-hole HB6. More specifically, wiring pattern PB12 having one end connected to terminal TB11 extends in the −X direction and reaches through-hole HB6.

As the configuration related to power supply circuit 4C, wiring pattern PC4 connects through-hole HC3 to terminal TC1. More specifically, wiring pattern PC4 having one end connected to through-hole HC3 extends in the +X direction and the −Y direction and reaches terminal TC1.

In addition, wiring pattern PC5 connects through-hole HC4 to terminal TC2. More specifically, wiring pattern PC5 having one end connected to through-hole HC4 extends in the +X direction and the −Y direction and reaches terminal TC2.

Furthermore, wiring pattern PC11 connects terminal TC10 to through-hole HC5. More specifically, wiring pattern PC11 having one end connected to terminal TC10 extends in the −X direction and reaches through-hole HC5.

Still furthermore, wiring pattern PC12 connects terminal TC11 to through-hole HC6. More specifically, wiring pattern PC12 having one end connected to terminal TC11 extends in the −X direction and reaches through-hole HC6.

Figure 5C:
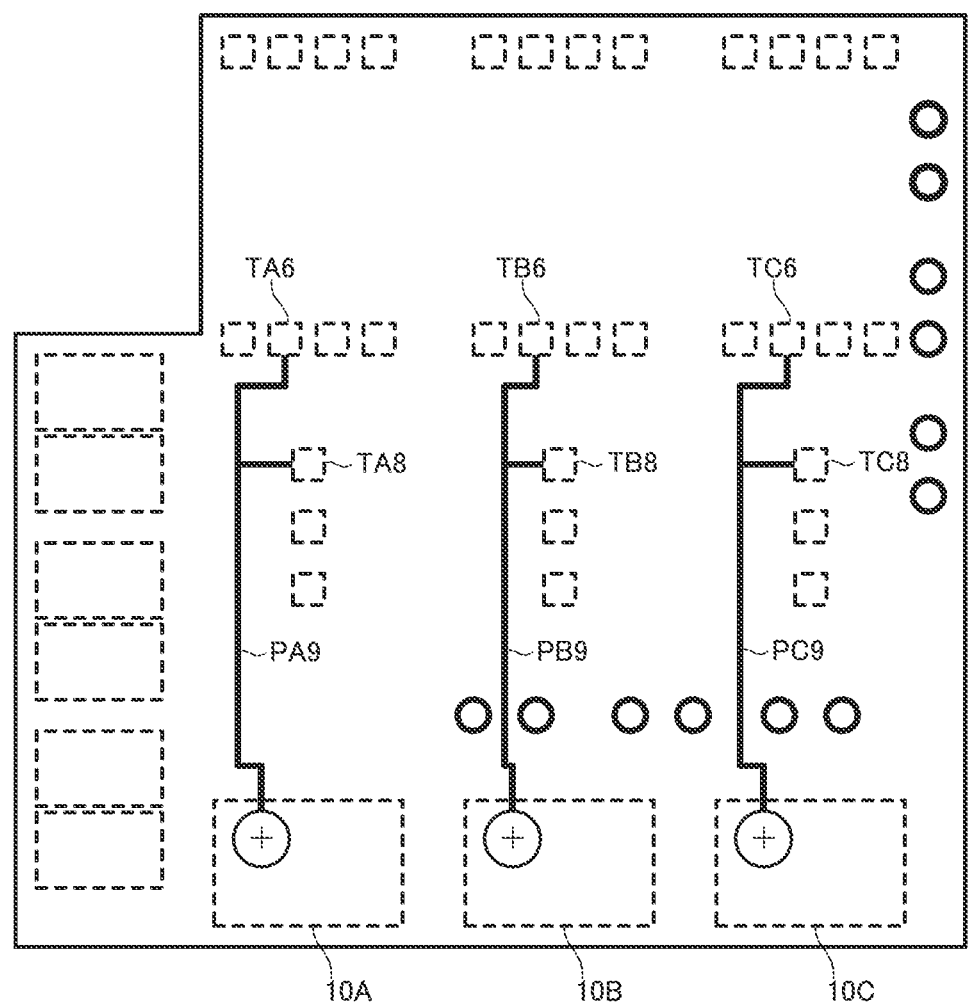
FIG. 5C is a schematic illustration of wiring patterns in a second layer of the junction board.

The wiring patterns in a second layer are described below. FIG. 5C is a schematic illustration of the wiring patterns in the second layer of junction board 400.

In the second layer, as the configuration related to power supply circuit 4A, wiring pattern PA9 connects terminal TA6 to each of the positive end of capacitor 10A and terminal TA8. More specifically, wiring pattern PA9 having one end connected to terminal TA6 extends in the −X direction and reaches each of terminal TA8 and the positive end of capacitor 10A.

As the configuration related to power supply circuit 4B, wiring pattern PB9 connects terminal TB6 to each of the positive end of capacitor 10B and terminal TB8. More specifically, wiring pattern PB9 having one end connected to terminal TB6 extends in the −X direction and reaches each of terminal TB8 and the positive end of capacitor 10B.

In addition, as a configuration related to power supply circuit 4C, wiring pattern PC9 connects terminal TC6 to each of the positive end of capacitor 10C and terminal TC8. More specifically, wiring pattern PC9 having one end connected to terminal TC6 extends in the −X direction and reaches each of terminal TC8 and the positive end of capacitor 10C.

Figure 5D:
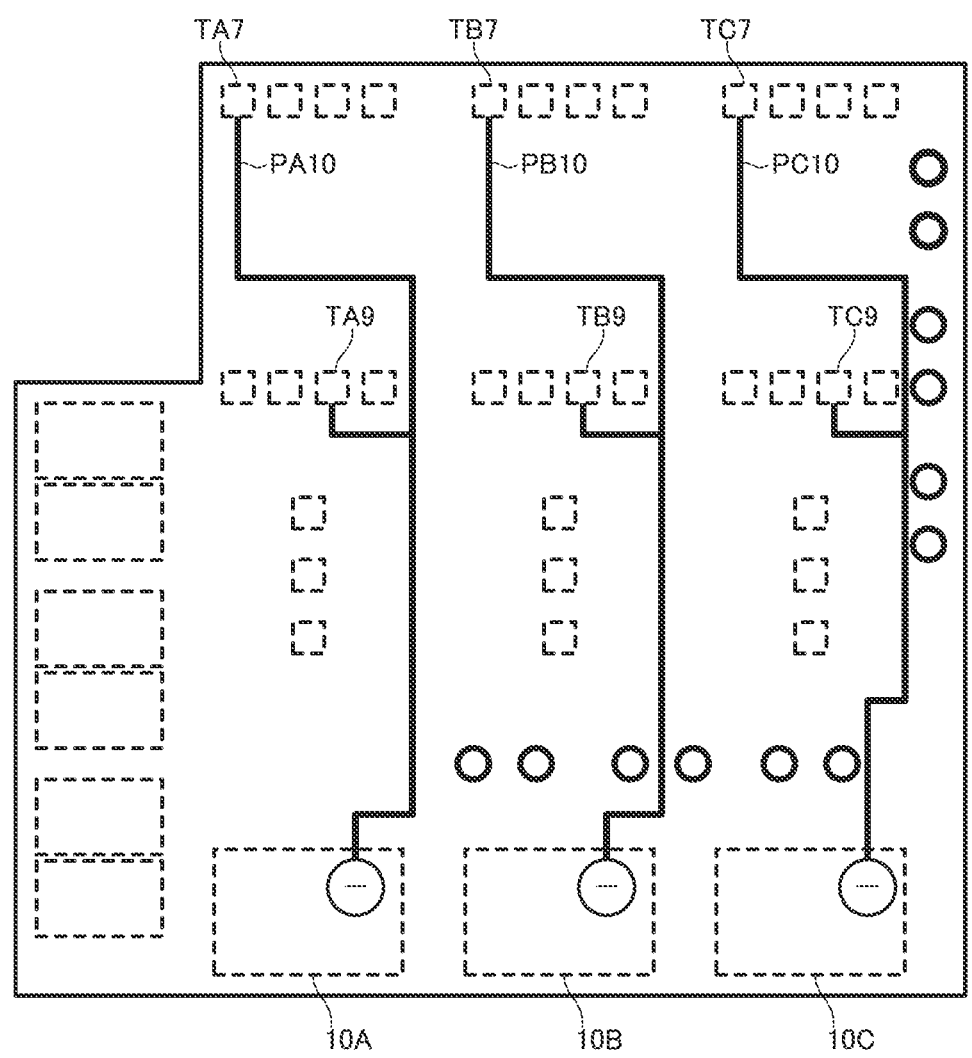
FIG. 5D is a schematic illustration of wiring patterns in a third layer of the junction board.

The wiring patterns in a third layer is described below. FIG. 5D is a schematic illustration of the wiring patterns in the third layer of junction board 400.

In the third layer, as the configuration related to power supply circuit 4A, wiring pattern PA10 connects terminal TA7 to each of the negative end of capacitor 10A and terminal TA9. More specifically, wiring pattern PA10 having one end connected to terminal TA7 extends in the −X direction and reaches each of terminal TA9 and the negative end of capacitor 10A.

In addition, as the configuration related to power supply circuit 4B, wiring pattern PB10 connects terminal TB7 to each of the negative end of capacitor 10B and terminal TB9. More specifically, wiring pattern PB10 having one end connected to terminal TB7 extends in the −X direction and reaches each of terminal TB9 and the negative end of capacitor 10B.

In addition, as the configuration related to power supply circuit 4C, wiring pattern PC10 connects terminal TC7 to each of the negative end of capacitor 10C and terminal TC9. More specifically, wiring pattern PC10 having one end connected to terminal TC7 extends in the −X direction and reaches each of terminal TC9 and the negative end of capacitor 10C.

Figure 5E:
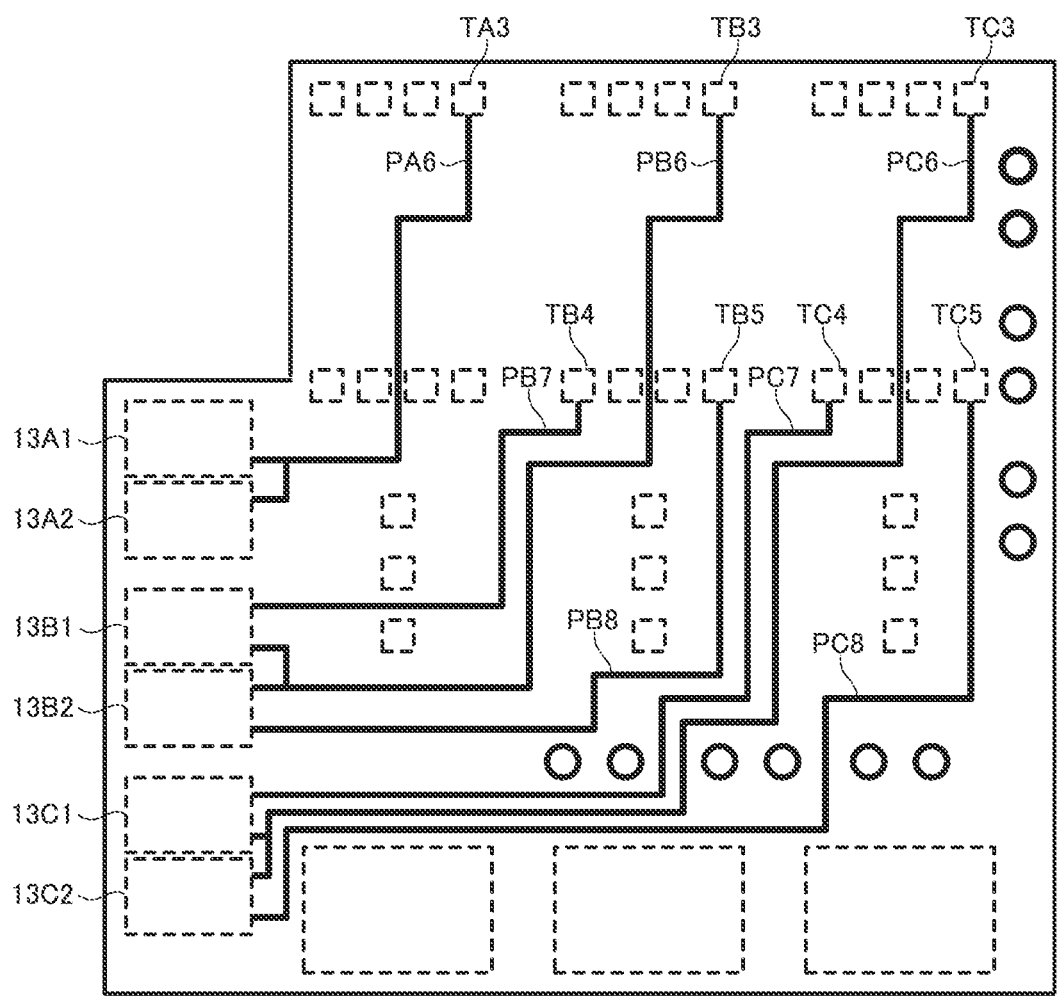
FIG. 5E is a schematic illustration of wiring patterns in a fourth layer of the junction board.

The wiring patterns in a fourth layer are described below. FIG. 5E is a schematic illustration of the wiring patterns in the fourth layer of junction board 400.

In the fourth layer, as the configuration related to power supply circuit 4A, wiring pattern PA6 connects terminal TA3 to each of the input terminal of coil 13A1 and the input end of coil 13A2. More specifically, wiring pattern PA6 having one end connected to terminal TA3 extends in the −X direction and the −Y direction and reaches each of the input end of coil 13A1 and the input end of coil 13A2.

As the configuration related to power supply circuit 4B, wiring pattern PB6 connects terminal TB3 to each of the input end of coil 13B1 and the input end of coil 13B2. More specifically, wiring pattern PB6 having one end connected to terminal TB3 extends in the −X direction and the −Y direction and reaches each of the input end of coil 13B1 and the input end of coil 13B2.

In addition, wiring pattern PB7 connects the output end of coil 13B1 to terminal TB4. More specifically, wiring pattern PB7 having one end connected to the output end of coil 13B1 extends in the +X direction and the +Y direction and reaches terminal TB4.

Furthermore, wiring pattern PB8 connects the output end of coil 13B2 to terminal TB5. More specifically, wiring pattern PB8 having one end connected to the output end of coil 13B2 extends in the +X direction and the +Y direction and reaches terminal TB5.

As the configuration related to power supply circuit 4C, wiring pattern PC6 connects terminal TC3 to the input end of coil 13C1 and the input end of coil 13C2. More specifically, wiring pattern PC6 having one end connected to terminal TC3 extends in the −X direction and the −Y direction and reaches each of the input end of coil 13C1 and the input end of coil 13C2.

In addition, wiring pattern PC7 connects the output end of coil 13C1 to terminal TC4. More specifically, wiring pattern PC7 having one end connected to the output end of coil 13C1 extends in the +X direction and the +Y direction and reaches terminal TC4.

Furthermore, wiring pattern PC8 connects the output end of coil 13C2 to terminal TC5. More specifically, wiring pattern PC8 having one end connected to the output end of coil 13C2 extends in the +X direction and the +Y direction and reaches terminal TC5.

Note that the type of wiring pattern provided in each of the layers is not limited to the above-described example.

(Driver Board)

Driver board 500 is described with reference to FIG. 6. Driver board 500 is configured by forming a wiring pattern on an insulating substrate that serves as a base.

A plurality of terminals TD1, TD2, TD3, TD4, TD5, TD6, TD7, TD8, TD9, TD10, and TD11 related to power supply circuit 4A are provided so as to protrude from the upper surface of driver board 500 in the +Z direction.

In addition, a plurality of terminals TE1, TE2, TE3, TE4, TE5, TE6, TE7, TE8, TE9, TE10, and TE11 related to power supply circuit 4B are provided so as to protrude from the upper surface of driver board 500 in the +Z direction.

Furthermore, a plurality of terminals TF1, TF2, TF3, TF4, TF5, TF6, TF7, TF8, TF9, TF10, and TF11 related to power supply circuit 4C are provided so as to protrude from the upper surface of driver board 500 in the +Z direction.

The terminals provided so as to protrude from the upper surface of driver board 500 in the +Z direction have all the same shape. Terminals TD1 to TD11, TE1 to TE11, and TF1 to TF11 correspond to terminals TA1 to TA11, TB1 to TB11, and TC1 to TC11 provided on junction board 400, respectively.

In addition, driver board 500 is provided with a plurality of through-holes that pass through driver board 500 in the Z direction (not illustrated in FIG. 6). Although described in more detail below, pin terminals 31 are inserted into the through-holes so as to protrude from power module board 600 in the +Z direction.

Transformer 17 is connected to driver board 500 via wiring. Note that, as illustrated in FIG. 3, transformer 17 is arranged at a position opposingly across junction board 400 from capacitor 10. As a result, the vertical dimension of casing 24 can be prevented from increasing.

(Power Module Board)

Power module board 600 is described with reference to FIG. 7. Power module board 600 is formed by applying an insulating coating made of, for example, an epoxy resin on an aluminum substrate that serves as a base and forming a wiring pattern on the insulating coating.

A power semiconductor (also referred to as a "power module"; the same applies hereinafter) that constitutes single-phase full-wave rectifier circuit 8, power factor correction circuit 9, and DC/DC converter 11 is mounted on the upper surface of power module board 600. Note that in the present specification, the term "power semiconductor" refers to a semiconductor that controls and supplies electric power.

More specifically, four diodes 12 in single-phase full-wave rectifier circuit 8, two switching elements 14 and two diodes 15 in power factor correction circuit 9, and four switching elements 20 and four diodes 23 in DC/DC converter 11 are mounted corresponding to each of the power supply circuits.

The input end of single-phase full-wave rectifier circuit 8 is located adjacent to the +X end of power module board 600. These power semiconductors are arranged at a positions from the input side (the side adjacent to external power supply 2) to the output side (the side adjacent to battery 3) of each of the power supply devices so as to be arranged in substantially the −X direction.

In addition, a plurality of pin terminals 31 (not illustrated in FIG. 7) for mechanically and electrically connecting the power semiconductors mounted on power module board 600 to the driver board are provided on the upper surface of power module board 600.

According to the present embodiment, power module board 600 has, disposed thereon, a power semiconductor that constitutes single-phase full-wave rectifier circuit 8 and power factor correction circuit 9, a power semiconductor that constitutes a primary side of DC/DC converter 11, and a power semiconductor that constitutes the secondary side of DC/DC converter 11, which need to be electrically insulated from one another.

In this case, noise is likely to be generated in each of the circuits due to interference between the AC system and the DC system. However, according to the present embodiment, AC filter circuit 7 is provided between the circuit and external power supply 2, and DC filter circuit 5 is provided between the circuit and battery 3. As a result, noise generated in each of the circuits can be appropriately prevented from flowing out into external power supply 2 or battery 3.

(DC Filter Board)

DC filter board 200 is described with reference to FIG. 8. DC filter board 200 is configured by forming a wiring pattern on an insulating substrate that serves as a base.

Electrical parts 38, such as capacitor 19, and a coil and a capacitor constituting DC filter circuit 5, are mounted on the upper surface of DC filter board 200, and each of the electrical parts is connected to a wiring pattern. In addition, output terminal 39 connected to a connector used to connect to battery 3 is provided adjacent to the −Y end of DC filter board 200.

Through-holes HA7, HA8, HB7, HB8, HC7, and HC8 corresponding to the above-described through-holes HA5, HA6, HB5, HB6, HC5, and HC6, respectively, are provided on DC filter board 200 at a location adjacent to the −X end of DC filter board 200 so as to be arranged in the +Y direction.

Each of the through-holes is one end of one of wiring patterns PA12, PA13, PB12, PB13, PC12, and PC13, and each of the wiring patterns is connected to capacitor 19 and the input end of DC filter circuit 5.

The output end of DC filter circuit 5 is connected to output terminal 39 used for connection to a connector, which is used for connection to battery 3, by using a wiring pattern.

(Control Board)

Control board 300 is described with reference to FIG. 9. Control board 300 is a printed board configured by forming a wiring pattern on an insulating substrate that serves as a base.

Electrical parts 40, such as a microcomputer and an integrated circuit that constitute control circuit 6, are mounted on the lower surface of control board 300, and each of electrical parts 40 is connected to a wiring pattern.

More specifically, a lead of each of a microcomputer, an integrated circuit, and the like is inserted into a lead through-hole (not illustrated) provided in control board 300 so as to penetrate from the lower surface to the upper surface, and soldering is performed.

(Structure of Connecting Portion Between Junction Board and Each of AC Filter Board and DC Filter Board)

Figure 10A:
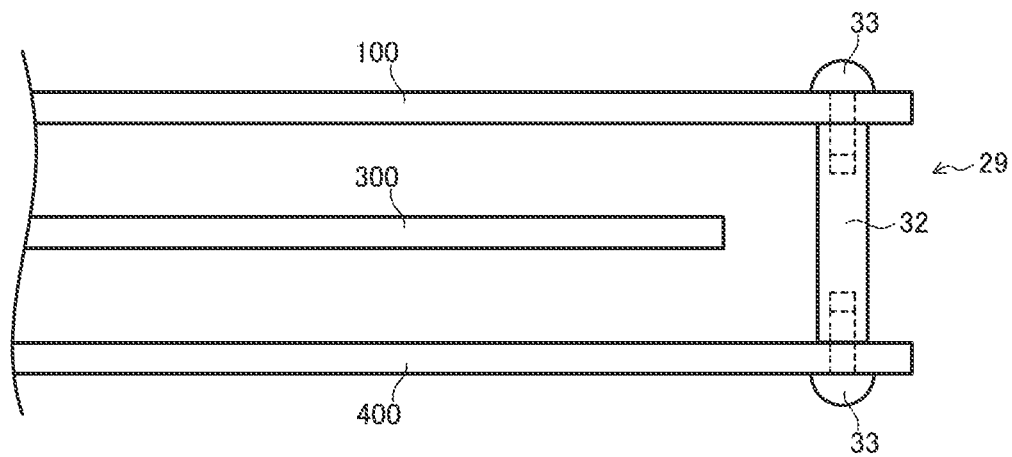
FIG. 10A is a partially enlarged cross-sectional view illustrating the connection structure between the AC filter board and the junction board.
Figure 10B:
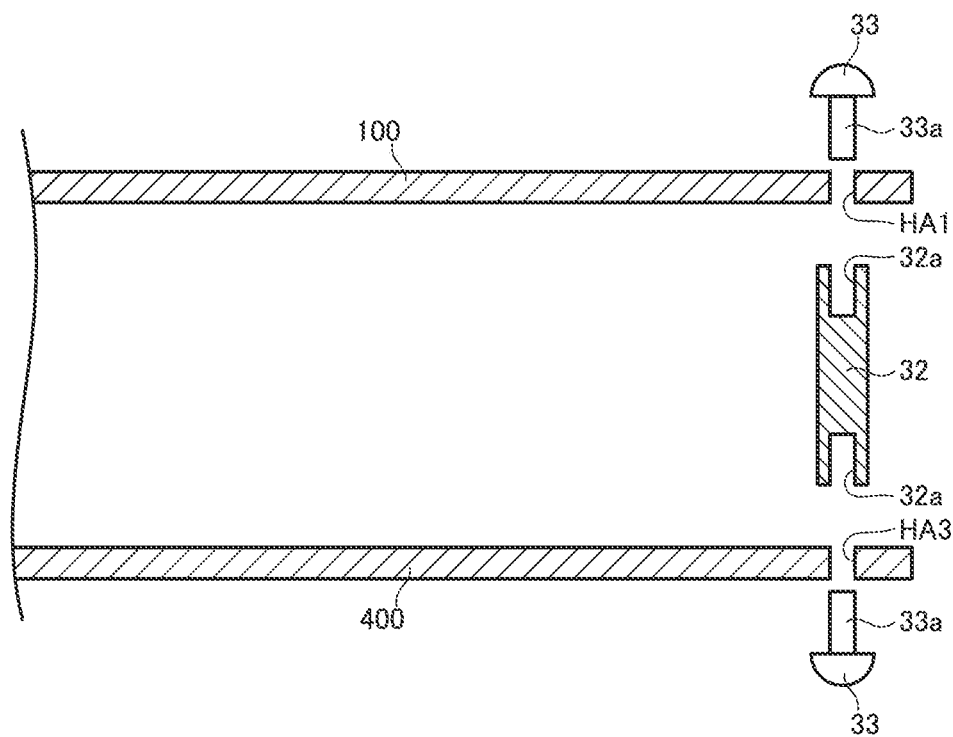
FIG. 10B is a partially enlarged cross-sectional view illustrating the connection structure between the AC filter board and the junction board.

The structure of connecting portion 29 that connects junction board 400 to each of AC filter board 100 and DC filter board 200 is described in detail with reference to FIGS. 10A and 10B. FIG. 10A and FIG. 10B are partially enlarged cross-sectional views illustrating the connection structure between AC filter board 100 and junction board 400. FIG. 10A is a diagram illustrating AC filter board 100 and junction board 400 connected to each other by connecting portion 29. FIG. 10B is a diagram illustrating a procedure for connection between AC filter board 100 and junction board 400.

As illustrated in FIG. 10A, junction board 400 is located opposingly across control board 300 from AC filter board 100 and DC filter board 200 in the −Z direction.

AC filter board 100 and DC filter board 200 are connected to junction board 400 by metal studs 32 extending along the Z-axis. Note that each of the metal studs electrically connects AC filter board 100 and DC filter board 200 to junction board 400.

Herein, an example of a connection structure is described in which through-hole HA1 provided in AC filter board 100 and through-hole HA3 provided in junction board 400 are connected to each other by metal stud 32.

As illustrated in FIG. 10B, female screw portion 32a is provided on each of one end surface and the other end surface of metal stud 32 so as to allow male screw portion 33a of screw 33 to be screwed thereinto.

After female screw portion 32a on one end surface of metal stud 32 is aligned with through-hole HAL one end surface of metal stud 32 is brought into contact with the lower surface of AC filter board 100, as needed. Subsequently, male screw portion 33a of screw 33 is screwed into female screw portion 32a. In this manner, AC filter board 100 and metal stud 32 are fixed to each other.

In addition, after female screw portion 32a on the other end surface of metal stud 32 is aligned with through-hole HA3, the other end surface of metal stud 32 is brought into contact with the upper surface of junction board 400, as needed. Subsequently, male screw portion 33a of screw 33 is screwed into female screw portion 32a. In this manner, junction board 400 and metal stud 32 are fixed to each other.

When AC filter board 100 and junction board 400 are connected to each other with connecting portion 29, through-hole HA1 and through-hole HA3 are electrically connected to each other via screws 33 and metal stud 32.

(Structure of Connecting Portion Between Junction Board and Driver Board)

Figure 11A:
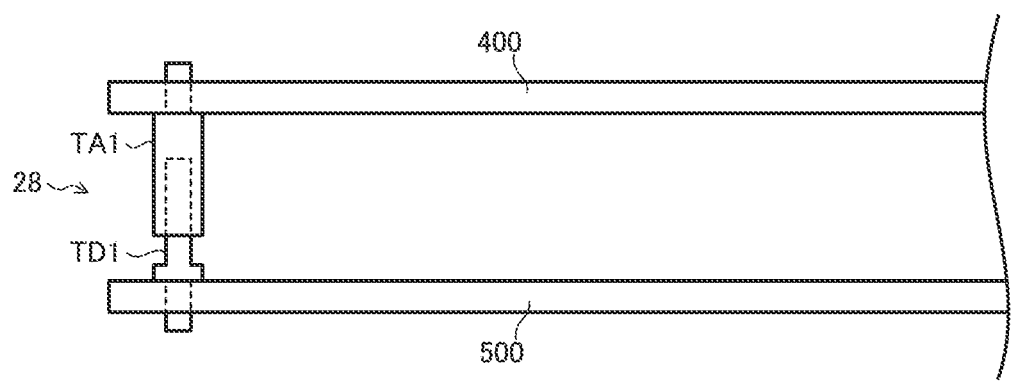
FIG. 11A is a partially enlarged cross-sectional view illustrating the connection structure between the junction board and the driver board.
Figure 11B:
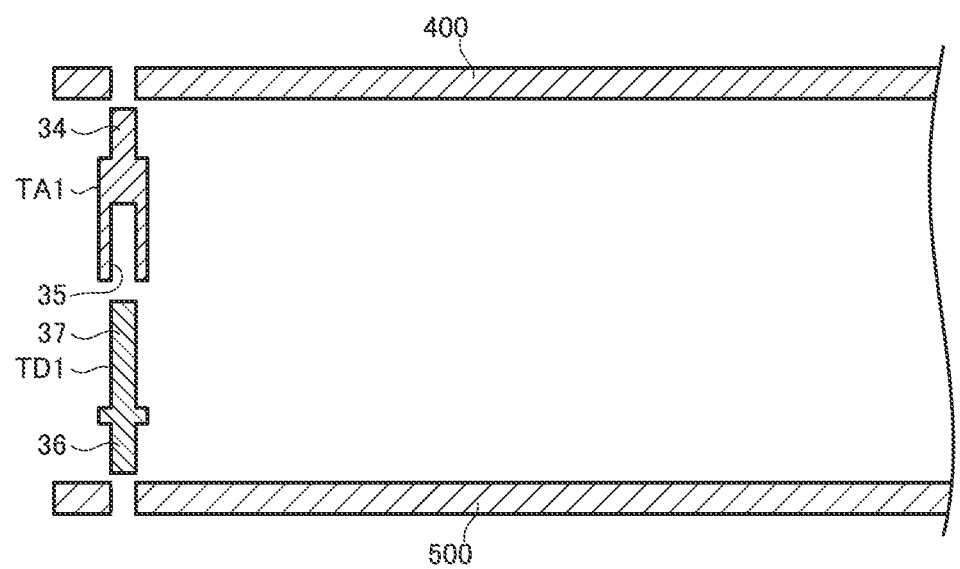
FIG. 11B is a partially enlarged cross-sectional view illustrating the connection structure between the junction board and the driver board.

The structure of connecting portion 28 that connects junction board 400 to driver board 500 is described in detail with reference to FIGS. 11A and 11B. FIGS. 11A and 11B are partially enlarged cross-sectional views illustrating a structure for connection between junction board 400 and driver board 500. FIG. 11A is a diagram illustrating junction board 400 and driver board 500 connected to each other by connecting portion 28. FIG. 11B is a diagram illustrating a procedure for connection between junction board 400 and driver board 500.

Herein, an example of a connection structure is described in which terminal TA1 provided on junction board 400 and terminal TD1 provided on driver board 500 are connected to each other.

Terminal TA1 has leg portion 34 to be inserted into a through-hole provided in junction board 400 and opening 35 for connection with terminal TD1. Terminal TA1 is fixed to junction board 400 by press fitting or push fitting leg portion 34 into the through-hole of junction board 400.

Terminal TD1 has leg portion 36 to be inserted into a through-hole provided in driver board 500 and tip portion 37 for connection with terminal TA1. Terminal TD1 is fixed to driver board 500 by press fitting or push fitting leg portion 36 into the through-hole of driver board 500.

Tip portion 37 of terminal TD1 is press fitted or push fitted into opening 35 of terminal TA1 with terminal TA1 and terminal TD1 fixed to junction board 400 and driver board 500, respectively. In this manner, terminal TA1 and terminal TD1 are connected to each other. Note that a tip portion may be provided in terminal TA1, and an opening may be provided in terminal TD1.

(Structure of Connecting Portion Between Driver Board and Power Module Board)

Figure 12A:
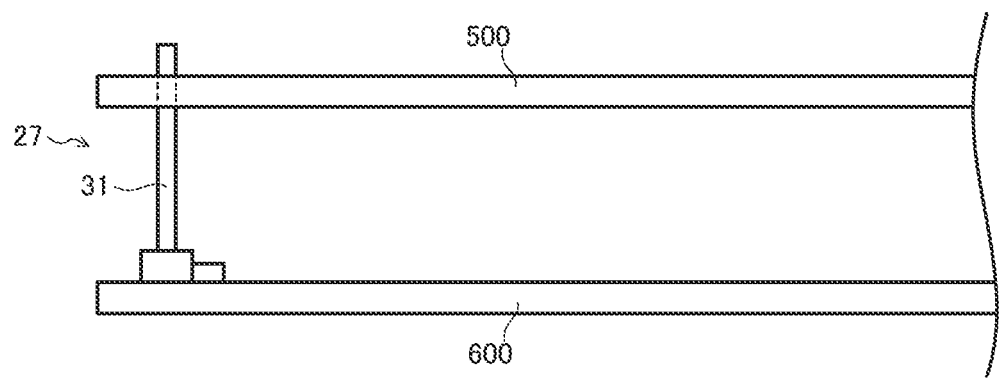
FIG. 12A is a partially enlarged cross-sectional view illustrating the connection structure between the driver board and the power module board.
Figure 12B:
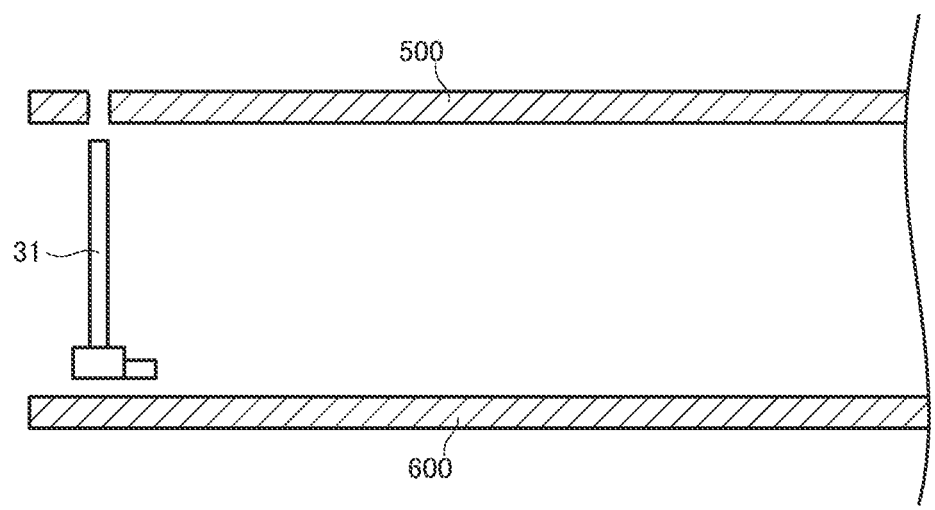
FIG. 12B is a partially enlarged cross-sectional view illustrating the connection structure between the driver board and the power module board.

The structure of connecting portion 27 that connects driver board 500 to power module board 600 is described in detail with reference to FIGS. 12A and 12B. FIGS. 12A and 12B are partially enlarged cross-sectional views illustrating the connection structure between driver board 500 and power module board 600. FIG. 12A is a diagram illustrating driver board 500 and power module board 600 connected to each other by connecting portion 27. FIG. 12B is a diagram illustrating a procedure for connection between driver board 500 and power module board 600.

Connecting portion 27 includes pin terminal 31 that is provided on the upper surface of power module board 600 and extends in the +Z direction and a through-hole provided in driver board 500.

More specifically, when pin terminal 31 is press fitted or push fitted into the through-holes of driver board 500, driver board 500 and power module board 600 are connected to each other. In addition, driver board 500 and power module board 600 are electrically connected to each other.

(Connection Structure of Each of Circuits Constituting Power Supply Device)

Herein, an example of the connection structure of each of the circuits is described which starts from external power supply 2 to battery 3 via power supply circuit 4A and DC filter circuit 5.

External power supply 2 is connected to the input end of AC filter circuit 7A. The input end of AC filter circuit 7A is provided adjacent to the −Y end of AC filter board 100, and the output end of AC filter circuit 7A is provided adjacent to the +Y end of AC filter board 100. As a result, the flow of electric power in AC filter circuit 7A is substantially a flow from the −Y end to the +Y end.

In addition, the input end of single-phase full-wave rectifier circuit 8 provided at the latter part of AC filter circuit 7A is provided adjacent to the +X end of power module board 600. Accordingly, junction board 400 is used to electrically connect the output end of AC filter circuit 7A provided adjacent to the +Y end of AC filter board 100 to the input end of single-phase full-wave rectifier circuit 8 provided adjacent to the +X end of power module board 600.

More specifically, the output end (the positive side) of AC filter circuit 7A is connected to one end of wiring pattern PA4 formed on junction board 400 via wiring pattern PA2 and connecting portion 29 (through-hole HA1, metal stud 32, and through-hole HA3).

In addition, the output end (the negative side) of AC filter circuit 7A is connected to one end of wiring pattern PA5 formed on junction board 400 via wiring pattern PA3 and connecting portion 29 (through-hole HA2, metal stud 32, and through-hole HA4). Note that the one end of wiring pattern PA4 and the one end of wiring pattern PA5 are located adjacent to the +Y end of junction board 400.

Wiring patterns PA4 and PA5 extend in the +X direction and the −Y direction from one end to the other end. The other end of wiring pattern PA4 and the other end of wiring pattern PA5 reach the terminals TA1 and TA2 located adjacent to the +X end of junction board 400, respectively.

Terminal TA1 forms connecting portion 28 together with terminal TD1 provided on driver board 500. In addition, terminal TA2 forms connecting portion 28 together with terminal TD2 provided on driver board 500. Furthermore, driver board 500 and power module board 600 are electrically connected to each other by connecting portion 27.

For this reason, the output end of AC filter circuit 7A provided adjacent to the +Y end of AC filter board 100 can be connected to the input end of single-phase full-wave rectifier circuit 8 provided adjacent to the +X end of power module board 600 via connecting portion 29, the wiring pattern formed on junction board 400, connecting portion 28, and connecting portion 27.

The output end on the positive side of single-phase full-wave rectifier circuit 8 is connected to terminal TA3 of junction board 400 via connecting portion 27 and connecting portion 28. Furthermore, the output end on the positive side of single-phase full-wave rectifier circuit 8 is connected to the input ends of coils 13A1 and 13A2 mounted adjacent to the −Y end of junction board 400 by wiring pattern PA6.

The output ends of coils 13A1 and 13A2 are connected to terminals TA4 and TA5 by wiring patterns PA7 and PA8, respectively. The output ends of coils 13A1 and 13A2 are further connected to the positive side of switching element 14 and the anode of diode 15 mounted on power module board 600 via connecting portion 28 and connecting portion 27.

The cathode of diode 15 is connected to terminal TA6 of junction board 400 via connecting portion 27 and connecting portion 28 again. The cathode of diode 15 is further connected to the positive side of capacitor 10A mounted adjacent to the −X end of junction board 400 via wiring pattern PA9 that extends in the −X direction.

In addition, the cathode of diode 15 is connected to the input end on the positive side of inverter 16 mounted on power module board 600 via wiring pattern PA9, connecting portion 28, and connecting portion 27.

The output end on the negative side of single-phase full-wave rectifier circuit 8 is connected to the negative side of switching element 14 and reaches terminal TA7 of junction board 400 via connecting portion 27 and connecting portion 28. The output end on the negative side of single-phase full-wave rectifier circuit 8 is further connected to the negative side of capacitor 10A mounted on the upper surface of junction board 400 at a location adjacent to the −X end of junction board 400 by wiring pattern PA10 that extends in the −X direction.

In addition, the output terminal on the negative side of single-phase full-wave rectifier circuit 8 is connected to the input end on the negative side of inverter 16 mounted on power module board 600 via wiring pattern PA10, connecting portion 28, and connecting portion 27.

The output end of inverter 16 is connected to power transmission coil 21 of transformer 17 connected to driver board 500 via connecting portion 27.

Power reception coil 22 of transformer 17 is connected to the input end of secondary side rectifier circuit 18 mounted on power module board 600 via connecting portion 27.

The output end (the positive side) of secondary side rectifier circuit 18 reaches terminal TA10 of junction board 400 via connecting portion 27 and connecting portion 28. The output end of secondary side rectifier circuit 18 is further connected to the positive side of capacitor 19 and the input end of DC filter circuit 5 mounted on DC filter board 200 via wiring pattern PA11 and connecting portion 29 (through-hole HA5, metal stud 32, and through-hole HA7).

Similarly, the output end (the negative side) of secondary side rectifier circuit 18 reaches terminal TA11 of junction board 400 via connecting portion 27 and connecting portion 28. The output end of secondary side rectifier circuit 18 is further connected to the negative side of capacitor 19 and the input end of DC filter circuit 5 mounted on DC filter board 200 via wiring pattern PA12 and connecting portion 29 (through-hole HA6, metal stud 32, and through-hole HA8). As described above, the output end of DC filter circuit 5 is located adjacent to the −Y end of DC filter board 200 and is connected to battery 3.

As described above, the electrical connection between junction board 400 and each of AC filter board 100 and DC filter board 200, the electrical connection between junction board 400 and driver board 500, and the electrical connection between driver board 500 and power module board 600 are connection along the Z-axis. Then, the flow of power along the XY plane is generated in each of the boards.

As a result, the size can be reduced, as compared with the case where the boards are connected with a harness. In addition, since the locations of the wiring can be fixed, a variation in EMC (electromagnetic compatibility) can be reduced.

(Method for Manufacturing Power Supply Device)

Figure 13:
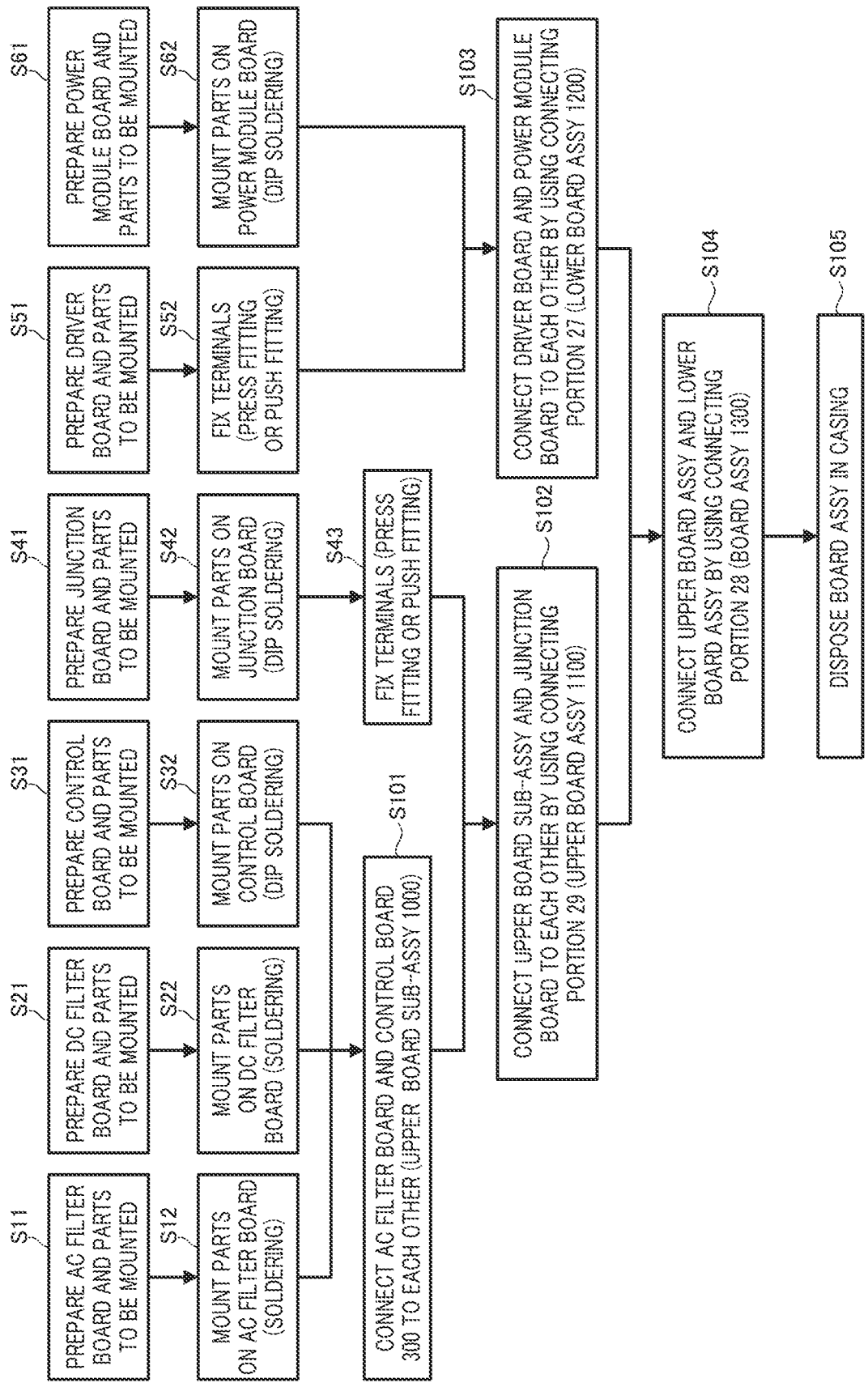
FIG. 13 is a flowchart illustrating a manufacturing process of the switching power supply device.

An example of a method for manufacturing power supply device 1 is described with reference to FIG. 13. Power supply device 1 is manufactured by, for example, mounting electrical parts on each of AC filter board 100, DC filter board 200, control board 300, junction board 400, driver board 500, and power module board 600 and, thereafter, connecting the boards to each other.

In terms of AC filter board 100, in step S11, AC filter board 100 and electrical parts to be mounted on AC filter board 100 are prepared.

In a subsequent step S12, these electrical parts are mounted on AC filter board 100. More specifically, the lead of each of the electrical parts is inserted into a corresponding through-hole of AC filter board 100 so as to penetrate from the upper surface to the lower surface, and soldering is performed.

Similarly, in terms of DC filter board 200, in step S21, DC filter board 200 and electrical parts to be mounted on DC filter board 200 are prepared.

In a subsequent step S22, these electrical parts are mounted on DC filter board 200. More specifically, the lead of each of the electrical parts is inserted into a corresponding through-hole of DC filter board 200 so as to penetrate from the upper surface to the lower surface, and soldering is performed.

In terms of control board 300, in step S31, control board 300 and electrical parts, such as a microcomputer and an integrated circuit, to be mounted on control board 300 are prepared.

In a subsequent step S32, these electrical parts are mounted on control board 300. More specifically, the lead of each of the electrical parts is inserted into a corresponding through-hole of control board 300 so as to penetrate from the lower surface to the upper surface, and soldering is performed.

AC filter board 100, DC filter board 200, and control board 300 each having the electrical parts mounted thereon are turned into a sub-ASSY in step S101. Thus, upper board sub-ASSY 1000 is formed. More specifically, AC filter board 100 and DC filter board 200 are disposed above control board 300 with a spacing between control board 300 and each of AC filter board 100 and DC filter board 200 and are fixed to each other by using screws or the like.

In terms of junction board 400, in step S41, junction board 400, capacitors and coils to be mounted on junction board 400, terminals TA1 to TA11, terminals TB1 to TB11, and terminals TC1 to TC11 are prepared.

In a subsequent step S42, these capacitors and coils are mounted on junction board 400. More specifically, the lead of each of the capacitors is inserted into a corresponding through-hole of junction board 400 so as to penetrate from the upper surface to the lower surface. In addition, the lead of each of the coils is inserted into a corresponding through-hole of junction board 400 so as to penetrate from the lower surface to the upper surface. Thereafter, the capacitors and the coils are soldered to junction board 400 by using the DIP soldering technique.

Furthermore, in step S43, terminals TA1 to TA11, terminals TB1 to TB11, and terminals TC1 to TC11 are fixed to junction board 400. As described above, to fix the terminals to junction board 400, the leg portion of each of the terminals is press fitted or push fitted into a corresponding through-hole of junction board 400.

In step S102, junction board 400 is fixed to upper board sub-ASSY 1000 to form upper board ASSY 1100. More specifically, junction board 400 is fixed to AC filter board 100 and DC filter board 200 in upper board sub-ASSY 1000 by using metal studs 32 and screws 33.

In contrast, in terms of driver board 500, driver board 500, terminals TD1 to TD11, terminals TE1 to TE11, and terminals TF1 to TF11 are prepared in step S51.

In a subsequent step S52, terminals TD1 to TD11, terminals TE1 to TE11, and terminals TF1 to TF11 are fixed to driver board 500. As described above, to fix the terminals to driver board 500, the leg portion of each of the terminals is press fitted or push fitted into a corresponding through-hole of driver board 500.

In addition, in terms of power module board 600, power module board 600 and a plurality of power semiconductors and a plurality of pin terminals 31 to be mounted on power module board 600 are prepared in step S61.

In a subsequent step S62, these power semiconductors and pin terminals are mounted on power module board 600. More specifically, the power semiconductors and the pin terminals are disposed on the upper surface of power module board 600 and are soldered by using the DIP soldering technique. Note that each of the power semiconductors is formed as a chip component and, thus, can be soldered to power module board 600 over a wide area.

Driver board 500 and power module board 600 each having the electrical parts mounted thereon are sub-assembled in step S103 to form lower board ASSY 1200. More specifically, each of the pin terminals mounted on the upper surface of power module board 600 is press fitted or push fitted into a corresponding through-hole of driver board 500, so that driver board 500 and power module board 600 are fixed to each other.

In step S104, upper board ASSY 1100 sub-assembled in step S102 and lower board ASSY 1200 sub-assembled in step S103 are connected to each other to form board ASSY 1300.

More specifically, the tip portions of terminals TD1 to TD11, terminals TE1 to TE11, and terminals TF1 to TF11 which protrude upward from driver board 500 in lower board ASSY 1200 are press fitted or push fitted into the openings of terminals TA1 to TA11, terminals TB1 to TB11, and terminals TC1 to TC11 protruding downward from junction board 400 in upper board ASSY 1100, respectively. In this manner, upper board ASSY 1100 and lower board ASSY 1200 are fixed to each other.

In step S105 subsequent to step S104, board ASSY 1300 is disposed in casing 24. More specifically, board ASSY 1300 is placed on bottom portion 25 of casing 24 such that the lower surface of power module board 600 is in contact with bottom portion 25, and board ASSY 1300 is fixed to casing 24 by using screws or the like.

According to the present manufacturing method, the boards each having electrical parts mounted thereon are connected to each other to form board ASSY 1300, and board ASSY 1300 is disposed in casing 24. As a result, the number of manufacturing steps can be reduced, as compared with the case where the electrical parts are mounted on the boards after the boards are disposed in the casing. In particular, since the DIP technique can be employed when electrical parts are mounted on a board, the number of manufacturing steps can be significantly reduced.

(Modification)

Figure 14:
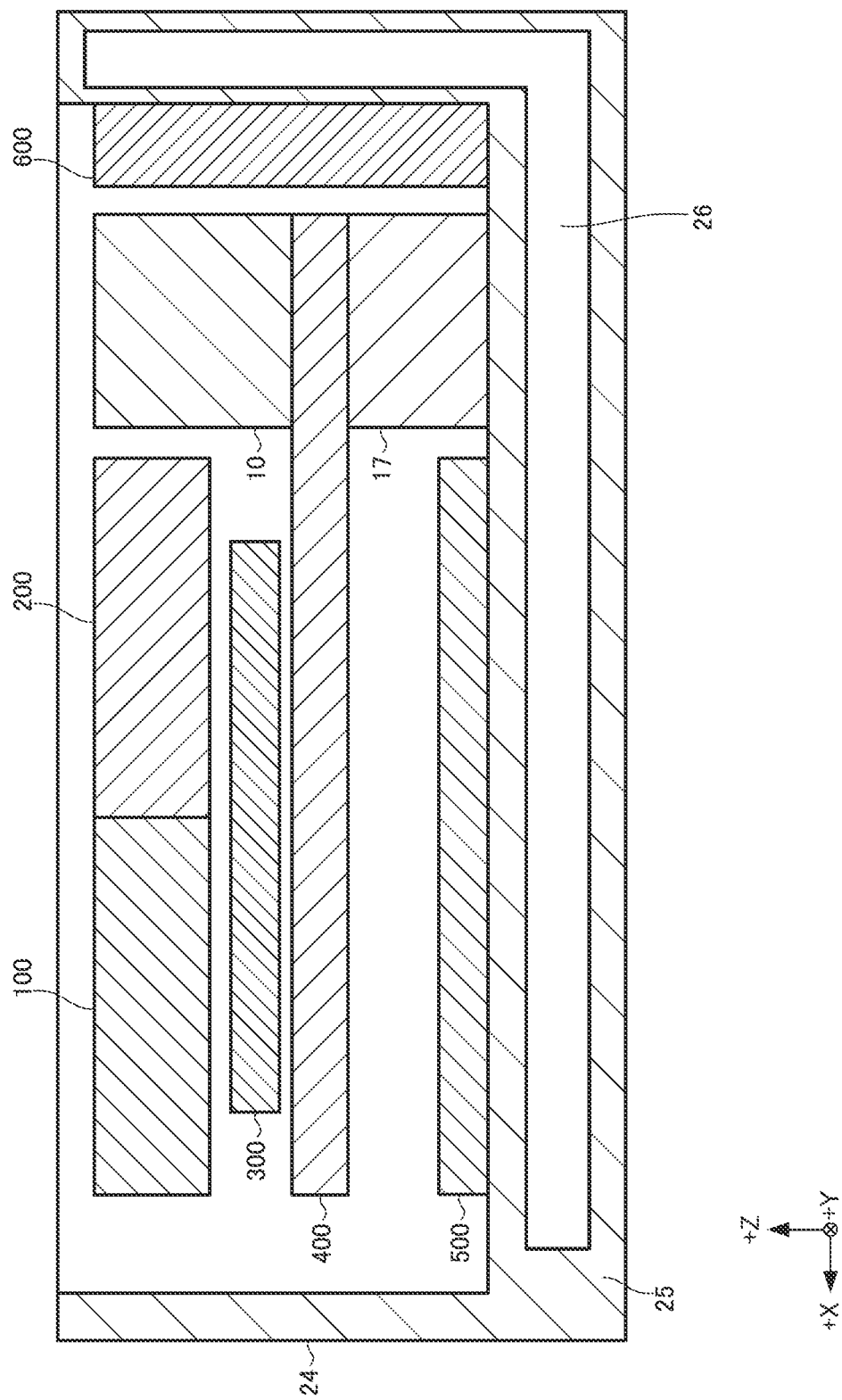
FIG. 14 is a cross-sectional view illustrating the configuration of a switching power supply device according to a modification of an embodiment of the present disclosure.

According to the structure of power supply device 1 of the present embodiment, as illustrated in FIG. 3, casing 24 includes a side portion and bottom portion 25, casing 24 has a box shape with an open top, and water jacket 26 that allows cooling water to flow therethrough is formed in bottom portion 25 of casing 24. However, as illustrated in FIG. 14, water jacket 26 may be disposed close to the plurality of surfaces. In this case, power module board 600 may be disposed on the side portion. Such a configuration can efficiently cool the heat-generating electrical parts mounted on power module board 600 by using the cooling water flowing through water jacket 26. Note that although not illustrated, the same effect can be obtained even when power module board 600 is separated and disposed on bottom portion 25 and the side portion.

As described above, according to the present embodiment, the switching power supply device having a plurality of power supply circuits connected to a multi-phase power supply is provided. The switching power supply device includes a first board having, mounted thereon, an electrical part that constitutes a filter circuit for preventing entry of noise from the external power supply, where an output end of the filter circuit is provided adjacent to one end in a first direction of the first board, a second board placed on a bottom portion of a casing that accommodates the switching power supply device, where the second board has, mounted thereon, a power semiconductor that constitutes a circuit provided at a latter part of the filter circuit and where an input end of the circuit provided at the latter part of the filter circuit is provided adjacent to one end in a second direction of the second board and where the second direction crossing the first direction, and a third board disposed between the first board and the second board, the third board having, formed thereon, a wiring pattern that electrically connects the output end to the input end.

As a result, the switching power supply device is capable of supporting a multi-phase AC and efficiently cooling the heat-generating electrical parts while reducing the size thereof.

The disclosure of Japanese Patent Application No. 2017-251243, filed on Dec. 27, 2017, including the specification, drawings and abstract, is incorporated herein by reference in its entirety.

INDUSTRIAL APPLICABILITY

According to the present disclosure, the board structure can support a multi-phase AC and efficiently cool a heat-generating electrical part while reducing the size thereof. The board structure is suitable for use in vehicles.

REFERENCE SIGNS LIST

1 Switching power supply device (power supply device)
2 External power supply
3 Battery
4A, 4B, 4C Power supply circuit
5 DC filter circuit
6 Control circuit
7, 7A, 7B, 7C AC filter circuit
8 Single-phase full-wave rectifier circuit
9 Power factor correction circuit
10, 10A, 10B, 10C Capacitor
11 DC/DC converter
12 Diode
13, 13A1, 13A2, 13B1, 13B2, 13C1, 13C2 Coil
14 Switching element
15 Diode
16 Inverter
17 Transformer
18 Secondary side rectifier circuit
19 Capacitor
20 Switching element
21 Power transmission coil
22 Power reception coil
23 Diode
24 Casing
25 Bottom portion
26 Water jacket
27 Connecting portion
28 Connecting portion
29 Connecting portion
30 Connector
31 Pin terminal
32 Metal stud
32a Female screw portion
33 Screw
33a Male screw portion
34 Leg portion
35 Opening
36 Leg portion
37 Tip portion
38 Electrical part
39 Output terminal
40 Electrical part
100 AC filter board
200 DC filter board
300 Control board
400 Junction board
500 Driver board
600 Power module board
1000 Upper board sub-ASSY
1100 Upper board ASSY
1200 Lower board ASSY
1300 Board ASSY
HA1, HA2, HA3, HA4, HA5, HA6, HA7, HA8 Through-hole
HB1, HB2, HB3, HB4, HB5, HB6, HB7, HB8 Through-hole
HC1, HC2, HC3, HC4, HC5, HC6, HC7, HC8 Through-hole
PA1, PA2, PA3, PA4, PA5, PA6, PA7, PA8, PA9, PA10, PA11, PA12, PA13 Wiring pattern
PB1, PB2, PB3, PB4, PB5, PB6, PB7, PB8, PB9, PB10, PB11, PB12, PB13 Wiring Pattern
PC1, PC2, PC3, PC4, PC5, PC6, PC7, PC8, PC9, PC10, PC11, PC12, PC13 Wiring Pattern
TA1, TA2, TA3, TA4, TA5, TA6, TA7, TA8, TA9, TA10, TA11 Terminal
TB1, TB2, TB3, TB4, TB5, TB6, TB7, TB8, TB9, TB10, TB11 Terminal
TC1, TC2, TC3, TC4, TC5, TC6, TC7, TC8, TC9, TC10, TC11 Terminal
TD1, TD2, TD3, TD4, TD5, TD6, TD7, TD8, TD9, TD10, TD11 Terminal
TE1, TE2, TE3, TE4, TE5, TE6, TE7, TE8, TE9, TE10, TE11 Terminal
TF1, TF2, TF3, TF4, TF5, TF6, TF7, TF8, TF9, TF10, TF11 Terminal

The invention claimed is:

1. A switching power supply device including a plurality of power supply circuits connected to a multi-phase power supply, comprising:
   a first board including, mounted thereon, an electrical part that constitutes a filter circuit for preventing entry of noise from the power supply, an output end of the filter circuit being provided adjacent to one end in a first direction of the first board;
   a second board placed on a bottom portion of a casing that accommodates the switching power supply device, the second board including, mounted thereon, a power semiconductor that constitutes a circuit provided at a latter part of the filter circuit, an input end of the circuit provided at the latter part of the filter circuit being provided adjacent to one end in a second direction of the second board, the second direction crossing the first direction; and
   a third board disposed between the first board and the second board, the third board including, formed thereon, a wiring pattern that electrically connects the output end to the input end.

2. The switching power supply device according to claim 1, wherein
   the second board includes, mounted thereon, all of power semiconductors that constitute the circuit provided at the latter part of the filter circuit.

3. The switching power supply device according to claim 1, wherein
   each of the power supply circuits includes a power factor correction circuit including a switching element, a diode, and a coil,
   the switching element and the diode are mounted on the second board, and
   the coil is mounted on the third board.

4. The switching power supply device according to claim 3, wherein
each of the power supply circuits includes a capacitor provided at a latter part of the power factor correction circuit, and
the capacitor is mounted on the third board.

5. The switching power supply device according to claim 1, wherein
the second board is an aluminum board.

* * * * *